(12) United States Patent
Tailliet et al.

(10) Patent No.: US 11,488,666 B2
(45) Date of Patent: Nov. 1, 2022

(54) NON VOLATILE STATIC RANDOM ACCESS MEMORY DEVICE AND CORRESPONDING CONTROL METHOD

(71) Applicant: STMicroelectronics (Rousset) SAS, Rousset (FR)

(72) Inventors: François Tailliet, Fuveau (FR); Marc Battista, Allauch (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 61 days.

(21) Appl. No.: 17/157,631

(22) Filed: Jan. 25, 2021

(65) Prior Publication Data

US 2021/0233586 A1    Jul. 29, 2021

(30) Foreign Application Priority Data

Jan. 27, 2020   (FR) ..................................... 2000761

(51) Int. Cl.
*G11C 7/00* (2006.01)
*G11C 14/00* (2006.01)

(52) U.S. Cl.
CPC ............................ *G11C 14/0063* (2013.01)

(58) Field of Classification Search
CPC .................................................. G11C 14/0063
See application file for complete search history.

(56) References Cited

U.S. PATENT DOCUMENTS

| | | | | |
|---|---|---|---|---|
| 5,986,932 A * | 11/1999 | Ratnakumar | .......... | G11C 14/00 365/185.24 |
| 6,011,727 A * | 1/2000 | Merritt | .................. | G11C 7/1048 365/189.04 |
| 6,469,930 B1 | 10/2002 | Murray | | |
| 7,092,293 B1 | 8/2006 | Young et al. | | |
| 7,394,711 B2 * | 7/2008 | Oh | .......................... | G11C 8/12 365/230.03 |
| 8,018,768 B2 | 9/2011 | Shih et al. | | |
| 8,331,150 B2 | 12/2012 | Hsu et al. | | |
| 9,245,627 B2 | 1/2016 | Taillliet et al. | | |
| 10,614,879 B2 | 4/2020 | Tailliet et al. | | |
| 10,706,928 B2 | 7/2020 | Tailliet et al. | | |
| 2009/0190402 A1 | 7/2009 | Hsu et al. | | |
| 2019/0237139 A1 | 8/2019 | McCollum et al. | | |

OTHER PUBLICATIONS

Prakash, R., "Nonvolatile SRAM (nvSRAM) Basics," Cypress® Embedded in Tomorrow™, Cypress Semiconductor Corp., Aug. 2016, 9 pages.

* cited by examiner

*Primary Examiner* — Pho M Luu
(74) *Attorney, Agent, or Firm* — Slater Matsil, LLP

(57) ABSTRACT

An integrated circuit comprises a memory device including at least one memory point having a volatile memory cell and a single non-volatile memory cell coupled together to a common node, and a single selection transistor coupled between the common node and a single bit line. A first output of the volatile memory cell is coupled to the common node, and a second output of the volatile memory cell, complementary to the first output, is not connected to any node outside the volatile memory cell.

28 Claims, 15 Drawing Sheets

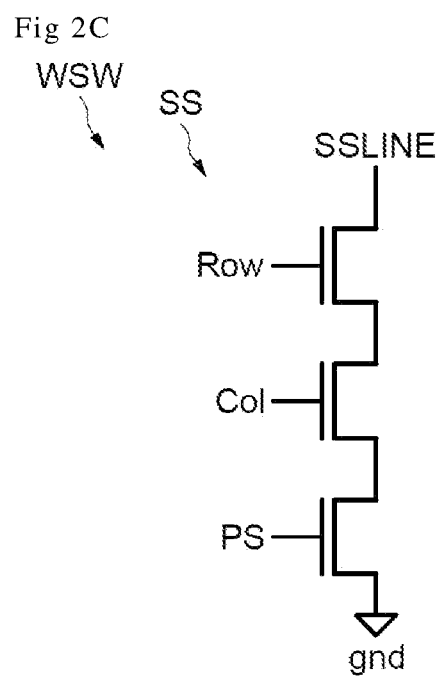

NON VOLATILE STATIC RANDOM ACCESS MEMORY DEVICE AND CORRESPONDING CONTROL METHOD

CROSS-REFERENCE TO RELATED APPLICATIONS

This application claims the benefit of French Application No. 2000761, filed on Jan. 27, 2020, which application is hereby incorporated herein by reference.

TECHNICAL FIELD

Embodiments of the invention relate to integrated circuits and methods, in particular those including memory devices such as non-volatile static random access memory devices.

BACKGROUND

Non-volatile static random access memories "NVSRAMs" are memories which combine, in a single memory point storing a binary datum, Static Random Access Memory "SRAM" cells, and non-volatile memory, for example of the electrically erasable and programmable type such as Electrically Erasable and Programmable Read Only Memory "EEPROM."

NVSRAM memories have the advantages of both technologies, that is to say, they do not lose information from the binary data when the circuit is off, and have unlimited write endurance.

Indeed, the write operations of the memory during operation are done on the volatile cells, while the write operations in the non-volatile cells are only done at the time of a shutdown of the integrated circuit, to save the data present in the volatile memory cells.

Conventionally, the almost only disadvantage of non-volatile static random access memories NVSRAM is the surface occupied by the memory points.

Indeed, in the conventional technologies, a dozen transistors are used in each memory point, with for example a typical SRAM cell with six transistors, assembled with a differential pair of non-volatile cells, for example of the flash memory type, typically including three transistors each.

Another disadvantage is the presence of a capacitor to supply energy for non-volatile storage operations when the memory is powered off. Its value is typically of the order of a hundred microFarads "µF," which negatively affects the congestion and the cost of these memories.

Thus it is desirable to benefit from more compact non-volatile static random access memories.

SUMMARY

Thus, according to one aspect, an integrated circuit is proposed, comprising a memory device including at least one memory point having a volatile memory cell and a single non-volatile memory cell coupled together to a common node, and a single selection transistor coupled between the common node and a single bit line, a first output of the volatile memory cell being coupled to the common node, while a second output of the volatile memory cell, complementary to the first output, is not connected to any node outside the volatile memory cell.

In other words, one of the two outputs of the volatile memory cell is coupled to the single non-volatile memory cell, while the other of the two outputs of the volatile memory cell is not coupled to a non-volatile memory cell, nor even to any node not belonging to the volatile memory cell as such.

It is thus proposed to use a single non-volatile memory cell per memory point, unlike conventional differential approaches wherein two non-volatile cells storing reverse data are each coupled to one of the two outputs of a volatile memory cell.

Furthermore, instead of a pair of bit lines conventionally used in the differential approaches, a single bit line is coupled to the memory point for accessing it in particular in read and write.

The number of transistors in each NVSRAM memory point is thus reduced, and the size of the memory device is reduced.

According to one embodiment, the volatile memory cell comprises a bi-stable latch including two inverters mounted antiparallel, and the non-volatile memory cell comprises a state transistor having a command gate and a floating gate and an access transistor coupled in series between the common node and the state transistor.

Non-volatile memory cells corresponding to an EEPROM-type technology are thus proposed, which is in particular advantageously in terms of energy consumption in read and write.

The memory point can thus advantageously include a number of transistors equal to 7.

According to one embodiment, the at least one memory point further comprises an isolation transistor coupled in series between the common node and the volatile memory cell, for example to facilitate read operations in the non-volatile memory cell.

The memory point can thus advantageously include a number of transistors equal to 8.

According to an advantageous embodiment, the memory device comprises a memory plane including a plurality of the memory points arranged in at least one memory word, and one local decoder per memory word comprising power lines coupled to power terminals of the volatile memory cells of the respective memory word, and configured to store a power status in a status register, a first value of the power status being representative of a non-operating state of the volatile memory cells of the respective memory word, a second value of the power status being representative of an operating state of the volatile memory cells of the respective memory word.

The power status allows for example conditioning the activation of the volatile or non-volatile memory cells of the respective memory word, and the power lines of the local decoder allow providing power voltages to the volatile memory cells of the corresponding memory word.

In embodiments defined hereinafter, sets of power voltages, each comprising a high level power voltage and a low level power voltage, are provided on the power lines of the decoder. These power voltages can be generated specifically for read or write operations in the corresponding memory word, for example in particular according to the power status.

According to one embodiment, the local decoder is configured to maintain a first set of power voltages on the power lines, adapted for a functional powering of the volatile memory cells, as long as the power status has the second value.

Thus, the volatile memory cells are powered in groups arranged in memory words, only if necessary, that is to say if the memory word has been written or modified, according to the power status. The volatile memory cells of the other memory words, in the non-operating state, are not powered.

According to one embodiment, the memory device further includes read means configured to generate first read signals adapted for timing read operations in the non-volatile memory cells of a selected memory word if the respective power status has the first value, and to generate second read signals adapted for timing read operations in the volatile memory cells of the selected memory word if the respective power status has the second value.

The read means are thus capable of reading directly from a non-volatile memory cell, as well as of reading directly from a volatile memory cell.

And, as long as there is no data written in the volatile memory cells, the data are read in the non-volatile memory cells, the volatile memory cells not being otherwise powered; and, as soon as data are written in the volatile memory cells, the data are read in the volatile memory cells.

According to one embodiment, the read means are configured to generate, among the first read signals, a second set of power voltages on the power lines of the selected memory word, adapted to impose a high impedance floating potential on the output coupled to the common node of the volatile memory cells.

The volatile memory cell is thus placed in a high impedance state on the positive output, in order to avoid interfering with a signal on the common access node originating from the volatile memory cell, during the reading of the non-volatile memory cell.

According to one embodiment, the read means comprise a read amplifier configured to generate, among the first and second read signals, a pre-charge voltage on the bit line of a memory point which is read, and to detect a variation in current or voltage on the bit line, during a read operation in the non-volatile memory cell and during a read operation in the volatile memory cell.

In other words, the volatile memory cell is read in the same way as the non-volatile memory cell, by means of a read amplifier advantageously allowing reliable and controlled readings.

Furthermore, the pre-charge voltage can advantageously be selected to avoid causing parasitic switching of the datum stored in the volatile memory cell.

According to one embodiment, the memory device further comprises write means configured to generate first write signals adapted for timing write operations in the volatile memory cells of a selected memory word independently of the value of the power status, the local decoder of the respective memory word being configured to provide the power status with the second value, after a write operation.

For example, all the writes, during normal operation of the integrated circuit, are made in the volatile memory cells, which are moreover permanently powered from the first write. The non-volatile memory cells are not used to store the data at each modification, which limits their wear.

According to one embodiment, the write means are configured to generate, among the first write signals, a third set of power voltages on the power lines of the selected memory word adapted to cease the function of the volatile memory cells, then a datum signal to be stored on the common node imposed via the bit line of the memory points of the selected memory word, and then a first set of power voltages on the power lines, adapted for a functional powering of the volatile memory cells.

This write operation allows writing data in volatile memory cells with a single asymmetric bit line, without differential writing on the complementary output, in a reliable manner and without electrical conflict between the power lines and the volatile memory cell outputs.

According to one embodiment, the write means are configured to generate, among the first write signals, a fourth set of power voltages on the power lines of the selected memory word, adapted for discharging the polarizations of internal nodes of the volatile memory cells of the selected memory word, before generating the third set of power voltages.

According to one embodiment, the write means are configured to generate second write signals adapted for timing a write operation of the non-volatile memory cells with a datum recorded in the volatile memory cell of the corresponding memory point, in all the memory words whose respective power status has the second value, in the case of shutdown of the memory device.

The non-volatile memory cells are thus automatically written with the present datum stored in the respective volatile memory cell, when implementing non-volatile writing.

For example, a shutdown of the integrated memory circuit can come from a stop command, or from an unexpected loss of power, for example in the event of a failure or disconnection of a power source.

The non-volatile writing can optionally be simultaneous with all the memory words of the memory plane whose respective status is representative of an operating state of the volatile memory cells.

The write operation of the non-volatile memory cells can comprise an erase cycle followed by a programming cycle each comprising charge injections into the floating gate of the state transistor by Fowler-Nordheim effect.

Thus, according to one embodiment, the write means are configured to generate, among the second write signals, an erase voltage on the command gate of the state transistor, and a first programming voltage on the command gate of the state transistor as well as a fifth set of power voltages on the power lines of the volatile memory cells adapted to bring the common node to a second programming voltage, in the memory words whose respective power status has the second value.

In other words, the erase voltage applied to the command gate of the state transistor alone allows the erasure by Fowler-Nordheim effect to be implemented.

The programming voltage is in turn configured on two components, according to a technique known as shared voltage technique, one being applied to the command gate of the state transistor, the other component being applied to the drain of the state transistor from the positive output of the volatile memory cell. The two components are selected so that a high level datum on the positive output causes programming by Fowler-Nordheim effect, and that a low level datum on the positive output does not generate a Fowler-Nordheim effect regarding the first component.

According to one embodiment, the integrated circuit further comprises a power device comprising a main power stage intended to supply a first power voltage adapted for the operation of the memory device, and a secondary power stage intended to supply a second power voltage adapted for powering the write operation of the non-volatile memory cells in the case of shutdown of the memory device.

Advantageously, the secondary power stage includes a capacitor intended to be charged at the second power voltage, and a first charge pump circuit configured to generate the second power voltage from the first power voltage, at a level higher than the level of the first power voltage.

Increasing the level of the second power voltage to charge the capacitor allows reducing the capacitive value allowing a sufficient amount of energy to be stored, and therefore reducing the size and cost of the capacitor.

The power device may further comprise at least one high voltage generator incorporated into the write means of the memory device, for generating the second write signals adapted for timing the write operation of the non-volatile memory cells, and, the high voltage generator advantageously comprises a plurality of elementary charge pump stages, the stages being adapted to be coupled in series so as to accumulate respective amplifications of the second power voltage, and a command means configured to measure the present value of the second power voltage and to command successive couplings of elementary charge pump stages in the series, following a decrease in the present value of the second power voltage.

The high-voltage generator including such a charge pump device with variable number of stages allows not only adapting a possible faster drop in the second power voltage coming from a smaller capacitor, but also optimally using the available energy supplied by the capacitor. Optimising the use of energy limits energy losses, and allows further reducing the size of the capacitor.

According to another aspect, a method for commanding a memory device as defined above is proposed, the memory device comprising a memory plane including a plurality of the memory points arranged in at least one memory word. The method comprises storing a power status for each memory word, a first value of the power status being representative of a non-operating state of the volatile memory cells of the respective memory word, a second value of the power status being representative of an operating state of the volatile memory cells of the respective memory word.

According to one embodiment, the method comprises maintaining a first set of power voltages powering in an operational state the volatile memory cells of the memory words whose power status has the second value.

According to one embodiment, the method further comprises generating first read signals timing read operations in the non-volatile memory cells of a selected memory word if the respective power status has the first value, and generating second read signals timing read operations in the volatile memory cells of the selected memory word if the respective power status has the second value.

According to one embodiment, the method comprises generating, among the first read signals, a second set of power voltages imposing a high impedance floating potential on the output coupled to the common node, in the volatile memory cells of the selected memory word.

According to one embodiment, the method comprises generating, among the first and second read signals, a pre-charge voltage on the bit line of a memory point, and detecting a variation in current or voltage on the bit line, during a read operation in the volatile memory cell and during a read operation in the non-volatile memory cell.

According to one embodiment, the method further comprises generating first write signals timing write operations in the volatile memory cells of a selected memory word independently of the value of the power status, and providing the respective power status with the second value, after a write operation.

According to one embodiment, the method comprises generating, among the first write signals, a third set of power voltages powering the volatile memory cells of the selected memory word, so as to cease the function of the volatile memory cells, then a datum signal to be stored on the common node imposed via the bit line of the memory points of the selected memory word, and then a first set of power voltages powering the volatile memory cells of the selected memory word in an operational state.

According to one embodiment, the method further comprises generating, among the first write signals, a fourth set of power voltages powering the volatile memory cells of the selected memory word so as to discharge the polarizations of internal nodes of the volatile memory cells of the selected memory word, before each generation of the third set of power voltages.

According to one embodiment, the method further comprises generating second write signals timing a write operation of the non-volatile memory cells with a datum recorded in the volatile memory cell of the corresponding memory point, in all the memory words whose respective power status has the second value, in the case of shutdown of the memory device.

According to one embodiment, the method comprises generating, among the second write signals, an erase voltage on the command gate of the state transistor, and a first programming voltage on the command gate of the state transistor as well as a fifth set of power voltages powering the volatile memory cells so as to bring the common node to a second programming voltage, in the memory words whose respective power status has the second value.

Some features mentioned above for an NVSRAM-type memory device, in particular the write and read operations in the volatile memory cells, can also be applied to an SRAM type memory device as such having a "mono bit line" structure, that is to say configured to access in read and write in a memory cell by a single bit line.

Also, according to another aspect, an integrated circuit is proposed, comprising a static volatile memory device including at least one memory point having a static volatile memory cell coupled to a single bit line, the static volatile memory cell comprising a first output and a second output complementary to the first output, and a single selection transistor coupled between the first output and a single bit line, the second output of the static volatile memory cell not being connected to any node outside the static volatile memory cell.

Such a memory point therefore differs from the conventional approach which provides a differential structure with two bit lines.

According to one embodiment, the volatile memory cell comprises a bi-stable latch including two inverters mounted antiparallel.

According to one embodiment, the memory device comprises a memory plane including a plurality of the memory points arranged in at least one memory word, and one local decoder per memory word comprising power lines coupled to power terminals of the volatile memory cells of the respective memory word, and configured to store a power status in a status register, a first value of the power status being representative of a non-operating state of the volatile memory cells of the respective memory word, a second value of the power status being representative of an operating state of the volatile memory cells of the respective memory word.

According to one embodiment, the local decoder is configured to maintain a first set of power voltages on the power lines, adapted for a functional powering of the volatile memory cells, as long as the power status has the second value.

According to one embodiment, the memory device further includes read means configured to generate read signals adapted for timing read operations in the volatile memory cells of a selected memory word if the respective power status has the second value.

According to one embodiment, the read means comprise a read amplifier configured to generate, among the read signals, a pre-charge voltage on the bit line of a memory point which is read, and to detect a variation in current or voltage on the bit line, during a read operation in the volatile memory cell.

According to one embodiment, the memory device further comprises write means configured to generate write signals adapted for timing write operations in the volatile memory cells of a selected memory word independently of the value of the power status, the local decoder of the respective memory word being configured to provide the power status with the second value, after a write operation.

According to one embodiment, the write means are configured to generate, among the write signals, a third set of power voltages on the power lines of the selected memory word, adapted to cease the function of the volatile memory cells, then a datum signal to be stored on the access node imposed via the bit line of the memory points of the selected memory word, and then a first set of power voltages on the power lines, adapted for a functional powering of the volatile memory cells.

According to another aspect, another method is also proposed for commanding such a memory device, the memory device comprising a memory plane including a plurality of the memory points arranged in at least one memory word, the method comprising storing a power status for each memory word, a first value of the power status being representative of a non-operating state of the volatile memory cells of the respective memory word, a second value of the power status being representative of an operating state of the volatile memory cells of the respective memory word.

According to one embodiment, the method comprises maintaining a first set of power voltages powering in an operational state the volatile memory cells of the memory words whose power status has the second value.

According to one embodiment, the method further comprises generating read signals timing read operations in the volatile memory cells of a selected memory word if the respective power status has the second value.

According to one embodiment, the method comprises generating, among the read signals, a pre-charge voltage on the bit line of a memory point, and detecting a variation in current or voltage on the bit line, during a read operation in the volatile memory cell.

According to one embodiment, the method further comprises generating write signals timing write operations in the volatile memory cells of a selected memory word independently of the value of the power status, and providing the respective power status with the second value, after a write operation.

According to one embodiment, the method comprises generating, among the write signals, a third set of power voltages powering the volatile memory cells of the selected memory word so as to cease the function of the volatile memory cells, then a datum signal to be stored on the access node imposed via the bit line of the memory points of the selected memory word, and then a first set of power voltages powering the volatile memory cells of the selected memory word in an operational state.

According to one embodiment, the method further comprises generating, among the write signals, a fourth set of power voltages powering the volatile memory cells of the selected memory word so as to discharge the polarizations of internal nodes of the volatile memory cells of the selected memory word, before each generation of the third set of power voltages.

Finally, the power device mentioned above can also be considered independently.

Also, an integrated circuit is proposed according to another aspect, including a power device comprising a main power stage intended to supply a first power voltage adapted for the operation of a memory device, and a secondary power stage intended to supply a second power voltage in the case of shutdown of the memory device, wherein the secondary power stage includes a capacitor intended to be charged at the second power voltage, and a first charge pump circuit configured to generate the second power voltage from the first power voltage, at a level higher than the level of the first power voltage.

According to one embodiment, the power device further comprises at least one high-voltage generator comprising a plurality of elementary charge pump stages, the stages being adapted to be coupled in series so as to cumulate respective amplifications of the second power voltage, and a command means configured to measure the present value of the second power voltage and to command successive couplings of elementary charge pump stages in the series, following a decrease in the present value of the second power voltage.

BRIEF DESCRIPTION OF THE DRAWINGS

Other advantages and features of the invention will appear upon examining the detailed description of non-limiting embodiments and the appended drawings, among which:

FIG. 2C illustrates a memory word status-selection communication circuit;

DETAILED DESCRIPTION OF ILLUSTRATIVE EMBODIMENTS

Figure 1:
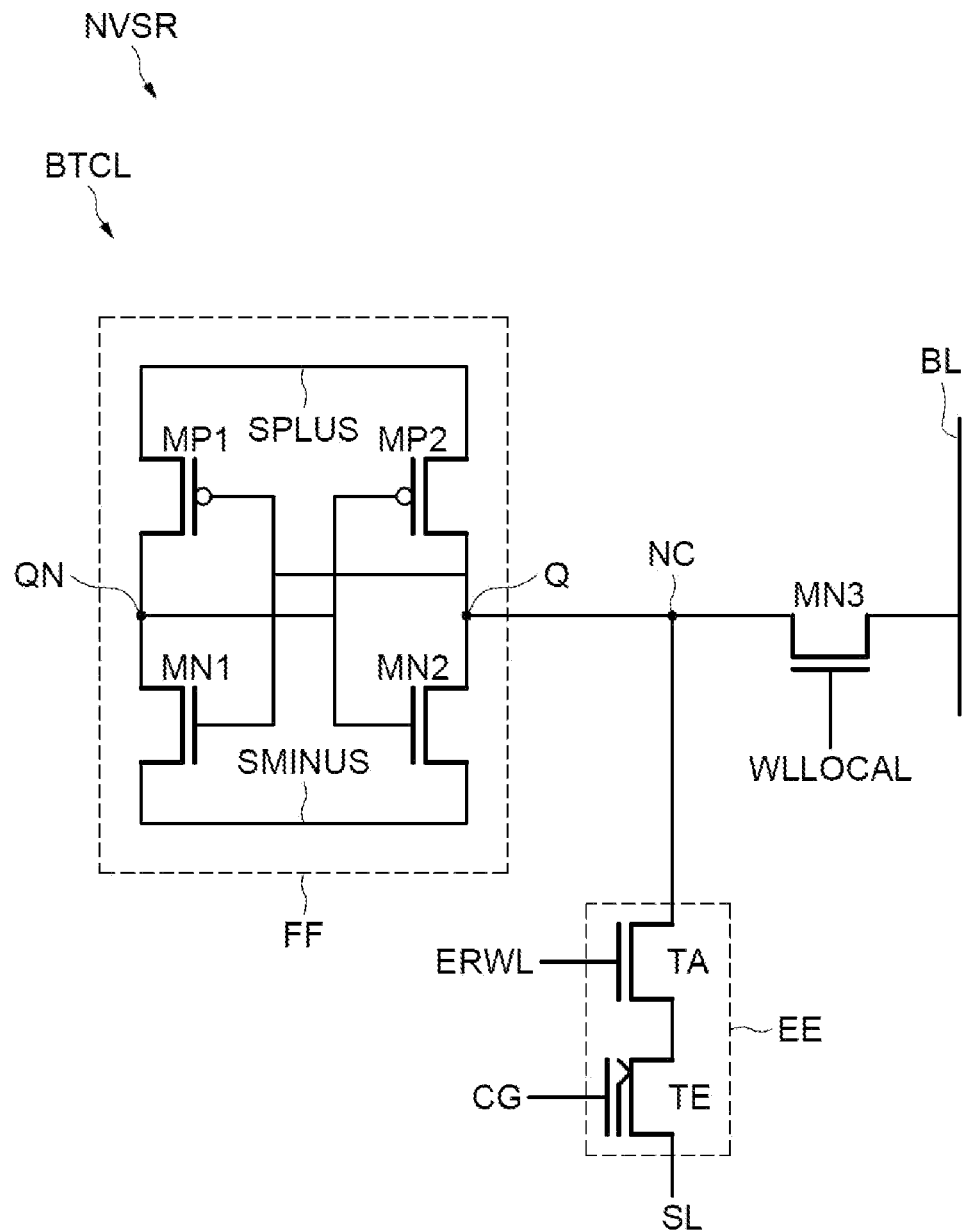
FIG. 1 illustrates a memory point.

FIG. 1 illustrates an example of a memory point BTCL, capable of storing a binary datum, of a static random access memory device NVSR. The memory point BTCL is of the "NVSRAM" type (for "Non-Volatile Static Random Access Memory"), and includes a volatile memory cell FF ("flip flop") of the "SRAM" type (for "Static Random Access Memory") and a non-volatile memory cell EE, of the "EEPROM" (for "Electrically Erasable and Programmable Read Only Memory") type.

In this example, the volatile memory cell FF comprises a bi-stable latch including two inverters mounted antiparallel, and thus has two outputs of reverse polarities Q, QN. The output Q is arbitrarily defined as being the positive output of the bi-stable latch, storing the binary datum, while the other output QN, called the complementary output, stores the reverse of the binary datum.

The first inverter of the bi-stable latch FF consists of a PMOS (for "P-type Metal Oxide Semiconductor", terminology perfectly known to the person skilled in the art) transistor, MP1, coupled between a high level power line SPLUS and the complementary output node QN, and an NMOS (for "N-type Metal Oxide Semiconductor") transistor, MN1, coupled between the complementary output node QN and a low level power line SMINUS, the transistors MP1, MN1 of this inverter are commanded by the positive output Q of the other inverter. The other inverter of the bi-stable latch FF also consists of a PMOS transistor, MP2, coupled between the high level power line SPLUS and the positive output node Q, and an NMOS transistor, MN2, coupled between the positive output node Q and the low level power line SMINUS, the transistors MP2, MN2 of this inverter being commanded by the complementary output QN of the first inverter.

The memory point BTCL further includes a single non-volatile memory cell EE coupled to the positive output Q, on a common node NC. The non-volatile memory cell EE, of the EEPROM type, comprises a state transistor TE having a command gate and a floating gate, and an access transistor TA coupled in series between the common node NC and the drain of the state transistor TE. The source of the state transistor TE is also coupled to a source line SL.

In the memory point BTCL, a selection transistor MN3 is coupled in series between the common node NC and a single bit line BL.

The bit line BL allows transmitting to the memory point BTCL a datum to be stored in the volatile memory cell FF, and reading the datum stored in either one of the volatile FF or non-volatile EE memory cells.

The memory point BTCL illustrated in FIG. 1 thus includes a number of transistors equal to seven.

According to one alternative, an additional isolation transistor (not shown), coupled in series between the common access node NC and the positive output Q of the volatile memory cell FF, composes a total of eight transistors per memory point BTCL. The isolation transistor allows isolating the volatile memory cell FF, in particular when reading the data stored in the non-volatile memory cell EE.

Figure 10:
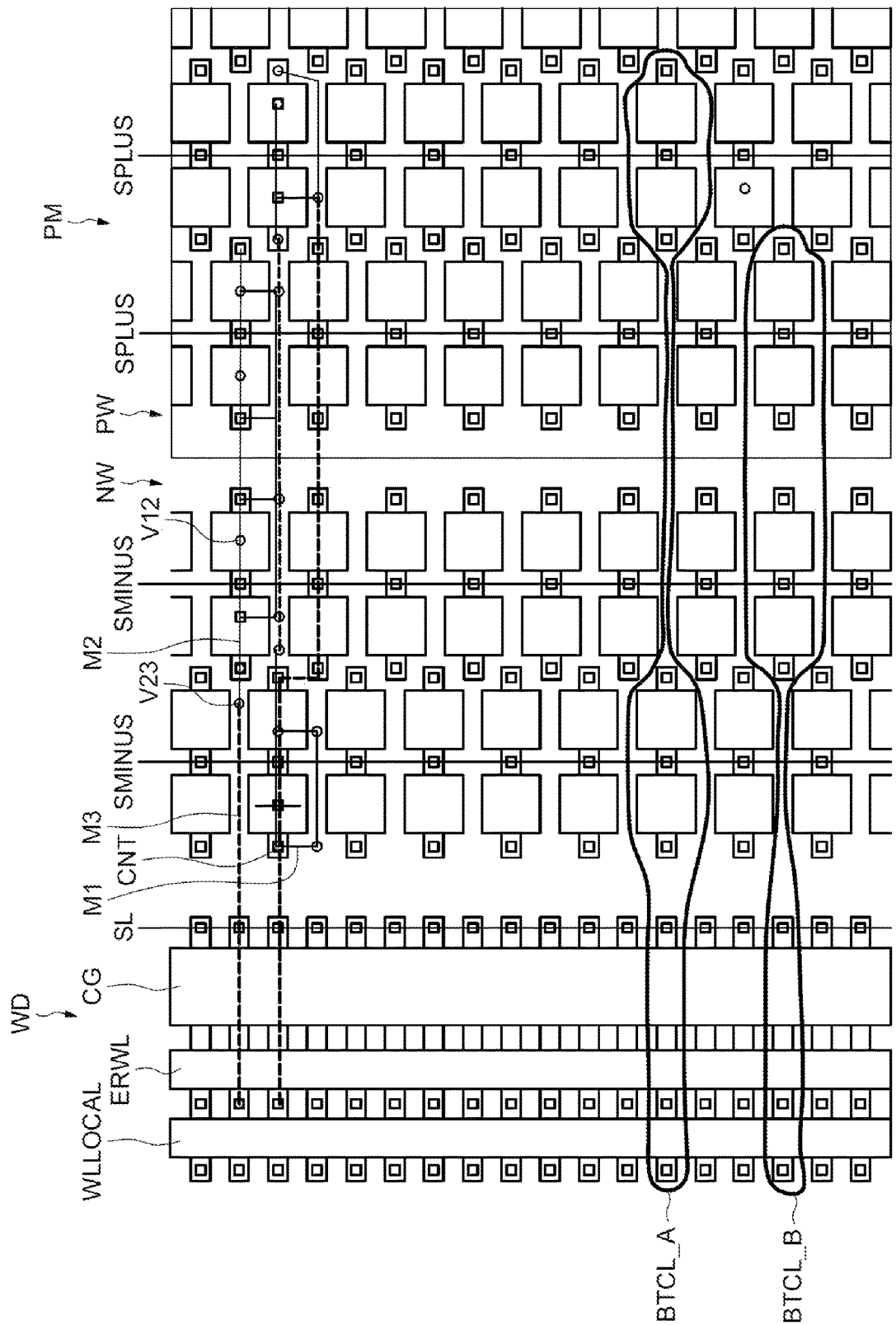
FIG. 10 illustrates organization of a memory plane including a plurality of memory points.
Figure 11:
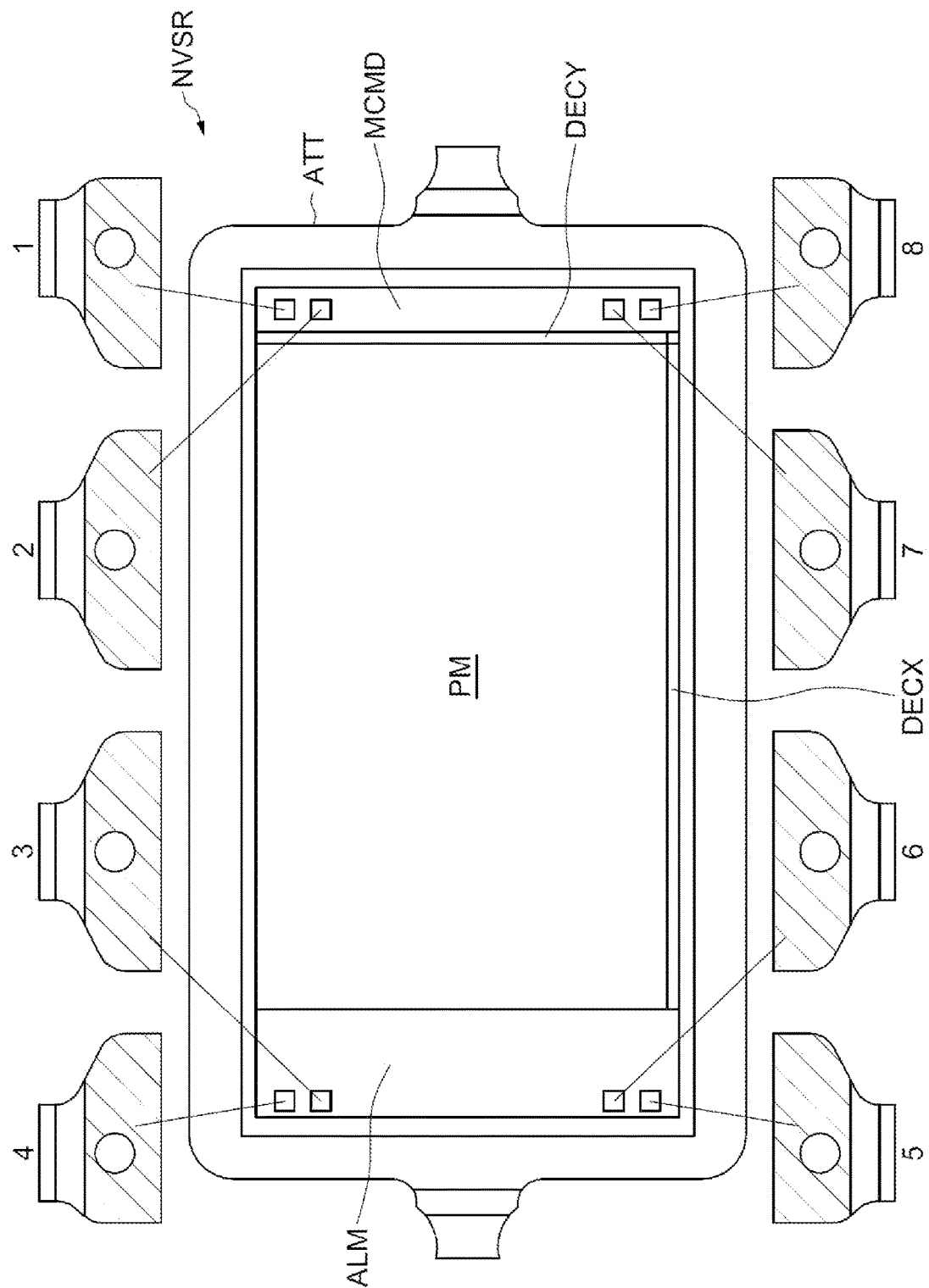
FIG. 11 illustrates an integrated circuit chip incorporating a non-volatile static random access memory device incorporating a memory plane.

Reference is made to FIGS. 10 and 11.

FIG. 10 illustrates an example of advantageous organization of a memory plane PM including a plurality of memory points BTCL as described in connection with FIG. 1. The memory points BTCL are arranged in the memory plane PM in memory words WD for example of 8, 16 or 32 bits, respectively including 8, 16 or 32 memory points BTCL. Bits of an error correction code ("ECC") are typically provided in addition in each memory word WD.

The selection transistors MN3 belonging to the same memory word WD are commanded on a common word selection line WLLOCAL; just like the access transistors TA of the non-volatile memory cells EE belonging to the same memory word WD are commanded on a common word line ERWL; and just like the state transistors TE of the non-volatile memory cells EE belonging to the same memory word WD are commanded on a common command grid line CG.

The gate regions of the transistors of the volatile memory cells FF are not shared by memory word WD, and these gate regions occupy substantially twice the width of the selection MN3, access TA and state TE transistors.

Thus the pairs of PMOS transistors MP1, MP2 of the memory points of a first type of architecture BTCL_A are arranged in a staggered manner relative to the pairs of PMOS transistors MP1, MP2 of the memory points of a second type of architecture BTCL_B, in the same N-type doped semiconductor well NW.

Similarly, the pairs of NMOS transistors MN1, MN2 of the memory points of a first type of architecture BTCL_A are arranged in a staggered manner relative to the pairs of NMOS transistors MN1, MN2 of the memory points of a second type of architecture BTCL_B, in the same P-type doped semiconductor well PW.

"Staggered" here means a regular and repeated arrangement between the elements one by one, wherein the position of one is offset by one unit lengthwise and by half a unit widthwise relative to the position on the other, considering that the different elements of each memory point are aligned in strips of length having half a unit of width.

Two metal lines belonging to a first metal level M1 are provided to form the high level power lines SPLUS of the pairs of PMOS transistors arranged in a staggered manner in the well PW; and two metal lines of the first metal level M1 are provided to form the low level power lines SMINUS of the pairs of NMOS transistors disposed in a staggered manner in the well NW.

A possibility for carrying out the electrical mounting of FIG. 1 on three metal levels is shown in FIG. 10, for the two types of memory point architecture BTCL_A, BTCL_B, by the first metal lines M1 coupled to the source, drain and grid regions by contacts CNT; by second metal lines M2 coupled to the first metal lines M1 by first via V12; and by third metal lines M3 coupled to the second metal lines M2 by second via V23.

Various possibilities for carrying out the mounting of FIG. 1 in the metal levels can of course be considered.

FIG. 11 shows an integrated circuit chip incorporating a non-volatile static random access memory device NVSR, incorporating a memory plane PM as described in connection with FIG. 10.

The device NVSR further incorporates a power stage ALM, for example advantageously as described hereinafter in connection with FIG. 12, as well as a command stage MCMD and row DECX and column DECY decoders for accessing the memory points BTCL of the memory plane PM.

The device NVSR, in the form of a chip, can be bonded to a metal attachment surface ATT ("die attach") intended to be encapsulated in an example of an eight-pin package, numbered from 1 to 8 and connected to different power and input-output terminals of the power ALM and command MCMD stages.

The memory points BTCL described in connection with FIG. 1 therefore have a minimum structure in number of transistors, and consequently a minimum unit area. In relation to the reduction in size, an activation of the SRAM cell using a local word decoder slightly more complex than in conventional structures will be described in connection with FIGS. 2 to 9. If the word is sufficiently large, for example of at least eight bytes, the size penalty of the local decoder is compensated by the unit area gain of the memory points BTCL multiplied by the number of memory points BTCL per word.

Thus, the chip presented in connection with FIG. 11 can for example have a memory capacity of 1 Mb and a size less than 8 mm².

FIGS. 2A, 2B, 2C and 2D together illustrate an example of a local word decoder WSW configured to control memory points BTCL as described above in connection with FIG. 1.

Figure 2A:
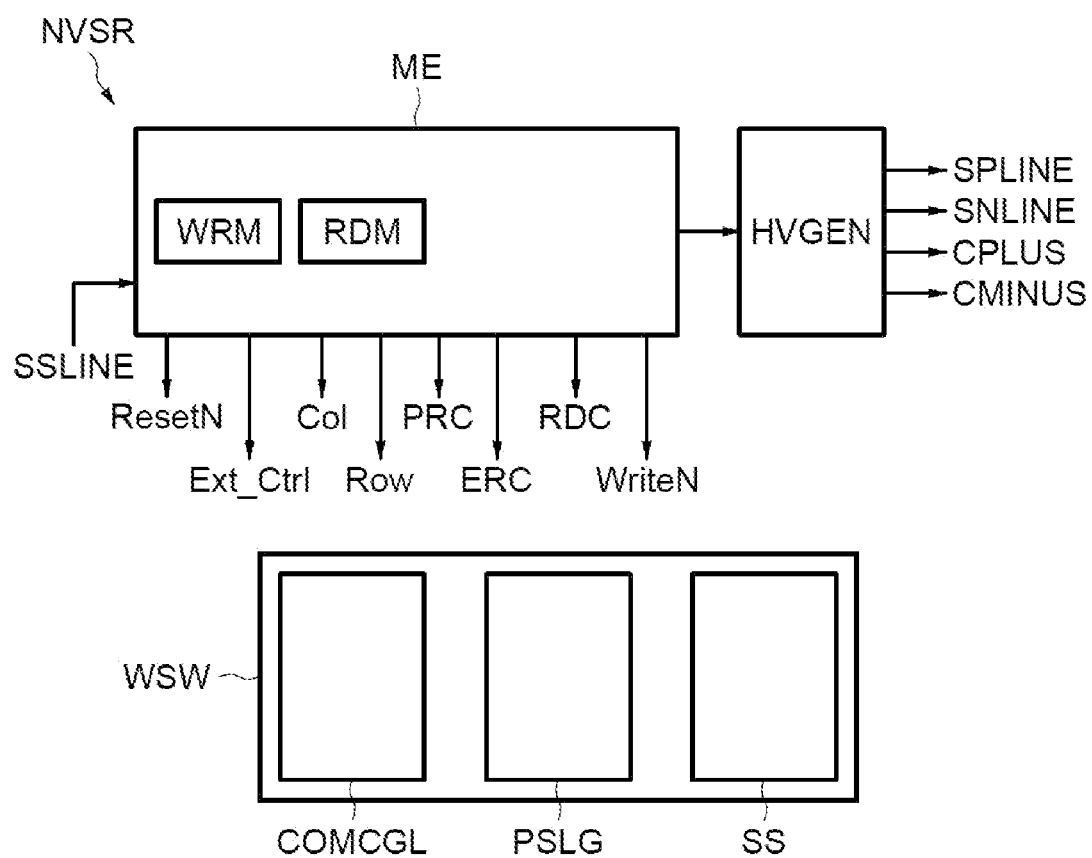
FIG. 2A illustrates a memory device including a local word decoder.

FIG. 2A schematically shows the memory device NVSR including a local word decoder WSW. The local word decoder WSW comprises a status generation logic circuitry PSLG (described below in connection with FIG. 2B), a memory word status-selection SS communication circuit (described below in connection with FIG. 2C), and a command gate latch command circuit COMCGL (described below in connection with FIG. 2D).

The memory device NVSR therefore includes one local decoder WSW per memory word WD, and each local decoder WSW is configured to control the memory points BTCL belonging to the memory word WD to which it is respectively dedicated.

The memory device NVSR further includes a state machine ME for timing the operation of the memory, in particular in response to external read or write commands.

The state machine ME is configured in this respect to generate command signals, particularly a reset signal ResetN, an external control signal Ext_Ctrl, a column selection signal Col, a row selection signal Row, a programming condition signal PRC, an erasure condition signal ERC, a read condition signal RDC, a write command signal WriteN, and read and write voltage, or stimuli, SPLINE, SNLINE, CPLUS, CMINUS. The write and read stimuli can have high voltage levels, and can thus be generated by a voltage generator HVGEN provided for this purpose.

For example, the state machine ME belongs to the command stage MCMD mentioned previously in connection with FIG. 11.

In an effort to segment the functions of the state machine ME, it is considered that the state machine ME is provided with read means RDM for timing the read operations, and write means WRM for timing the write operations.

Figure 2B:
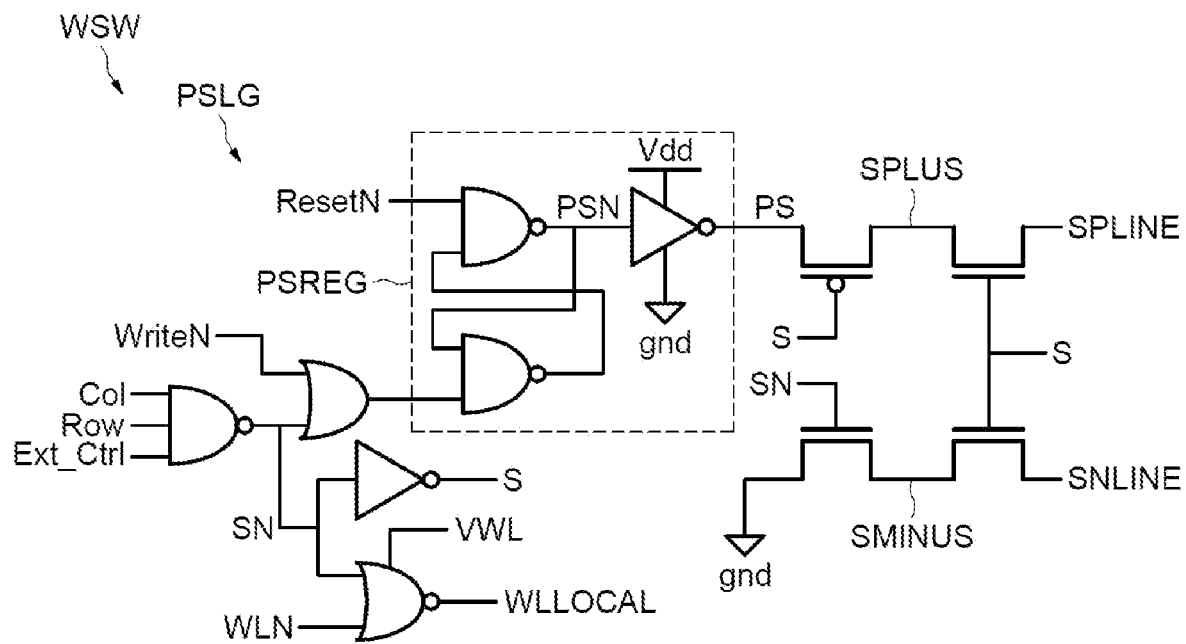
FIG. 2B illustrates logic circuitry for generating a status of each local decoder.

FIG. 2B illustrates an example of the logic circuitry for generating the status PSLG of each local decoder WSW.

Each local decoder WSW is configured to supply power voltages to the volatile memory cells FF on power lines SPLUS, SMINUS, and to provide a power status PS to the respective memory word.

The local decoders WSW are further configured to transmit the read and write stimuli to the volatile memory cells FF or to the non-volatile memory cells EE (see FIG. 2D), in a manner adapted to the state of the respective memory word, and according in particular to selection conditions Col, Row of the memory word. The state of each memory word WD is defined by the power status PS, recorded in a status register PSREG of the respective local decoder WSW.

As will appear below, a first value of the power status PS, for example the ground gnd, is representative of a non-operating state P0 of the volatile memory cells FF of the respective memory word WD, while a second value of the power status PS, for example the power voltage Vdd, is representative of an operating state P1 of the volatile memory cells FF of the respective memory word WD.

Indeed, a word is selected from the other memory words of the memory plane by a physical row address Row and a physical column address Col. The row Row and column Col physical addresses are for example the result of a decoding, by the state machine ME, of a logical address received in an external command.

For convenience, the high and low logic levels of various signals, in particular the power status PS, will be designated by "1" and "0" below, these high and low logic levels possibly being respectively the power voltage Vdd and the ground voltage gnd; also, the references of structural elements (such as the power lines SPLUS, SMINUS) can be used to designate the signals or the values of the signals applied thereto, and vice versa.

The status register PSREG is reset to PS=0 when the device is powered up, by means of a signal ResetN generated by the state machine ME. The signal ResetN is active at "0", and in the absence of a reset command, the signal ResetN is at "1" (inactive).

A triple input condition is tested on the address signals Col, Row, as well as on an external control signal Ext_Ctrl generated by the state machine ME. If these three signals Col, Row, Ext_Ctrl, are checked (all at 1), then a signal for selecting the word S is set to 1, and the complementary signal SN is set to 0. Conversely, if at least one of the three signals Col, Row, Ext_Ctrl is not checked (at least one at 0), then S=0 and SN=1.

A memory word is selected when the selection signal S of the decoder dedicated to this word is equal to 1, S=1, SN=0.

An output condition is tested on the word selection signal S and its complementary SN, to distribute the power voltages of high level SPLUS and low level SMINUS to the bi-stable latches of the volatile memory cells FF as described in connection with FIG. 1.

The output condition and the voltage distribution can be materialized by a set of transistors MOS, so that:

If S=0 and SN=1, then SPLUS=PS and SMINUS=gnd.

If S=1 and SN=0, then SPLUS=SPLINE, and SMINUS=SNLINE, SPLINE and SNLINE being lines traversing the memory plane PM, on which are generated the read and write stimuli by the state machine ME.

Thus, the external control signal Ext_Ctrl of the state machine ME conditionally gives control to the state machine ME, via the transmission lines SPLINE and SNLINE, on the power supplies SPLUS, SMINUS of the non-volatile memory cells FF of the memory word WD selected by Col, Row.

The word selection signal at S=0 and SN=1 conditions the power voltages SPLUS=PS and SMINUS=gnd.

First, PS=0=gnd because of the power-up reset (ResetN). In this case, SPLUS=gnd and SMINUS=gnd. This corresponds to a power-off state P0 (FIG. 3) of the volatile memory cells FF.

Second, if PS=1=Vdd, and S=0 and SN=1, then SPLUS=PS=Vdd and SMINUS=gnd. This corresponds to a functional powered state P1 (FIG. 3) of the volatile memory cells FF.

As will be seen below, the status PS is brought to the power voltage Vdd, PS=Vdd=1, definitively after the first write in the memory word.

Indeed, when writing in the memory word, the state machine ME generates the external control signal Ext_Ctrl=1 and a write signal WriteN (active at 0).

The signals SN=0 and WriteN=0 constitute a unique set condition (Set) of the status register PSREG which definitively records (at least, as long as the reset signal ResetN is not reactivated) the power status signal PS at 1, PS=1=Vdd.

The write operation is then timed by the state machine ME, for example as described below in connection with FIGS. 4 and 8.

During the read and write operations, the common node NC is coupled to the bit line BL by a command WLLOCAL supplied on a local word line, coupled to the selection transistor gates MN3 of the memory word. The command WLLOCAL is generated by a condition on the word selection signal S or its complementary SN, and on a word line command WLN (active at 0), so as to transcribe the word line command WLN at a useful voltage VWL for operation in the selected memory words S=1, SN=0. The useful voltage VWL is once again generated by the state machine ME, or possibly by the generator HVGEN.

The local decoder WSW is thus, in particular, configured to maintain a functional power P1 of the volatile memory cells FF of the memory word WD, as long as the power status PS is recorded at the second value Vdd.

FIG. 2C illustrates an example of a memory word status-selection SS communication circuit.

The local decoder WSW is indeed configured to transmit the state of the memory word to the state machine ME, on a status and selection line SSLINE of the memory word status-selection SS communication circuit.

The status and selection line SSLINE includes three transistors in series between an input of the state machine ME and a ground terminal gnd, each being commanded on its grid by respectively one of the selection signals Col, Row and the power status PS.

Thus, the state machine ME can probe the status and selection line SSLINE and detect either a ground voltage gnd (if the three transistors are on), representative of a selected memory word and of an operating state P1 of its volatile memory cells FF; either a high impedance open switch terminal (HIMP, FIG. 4) (if at least one of the three transistors is off) representative of a memory word which is not selected, or selected but whose volatile memory cells FF are non-operating PS=0.

Figure 2D:
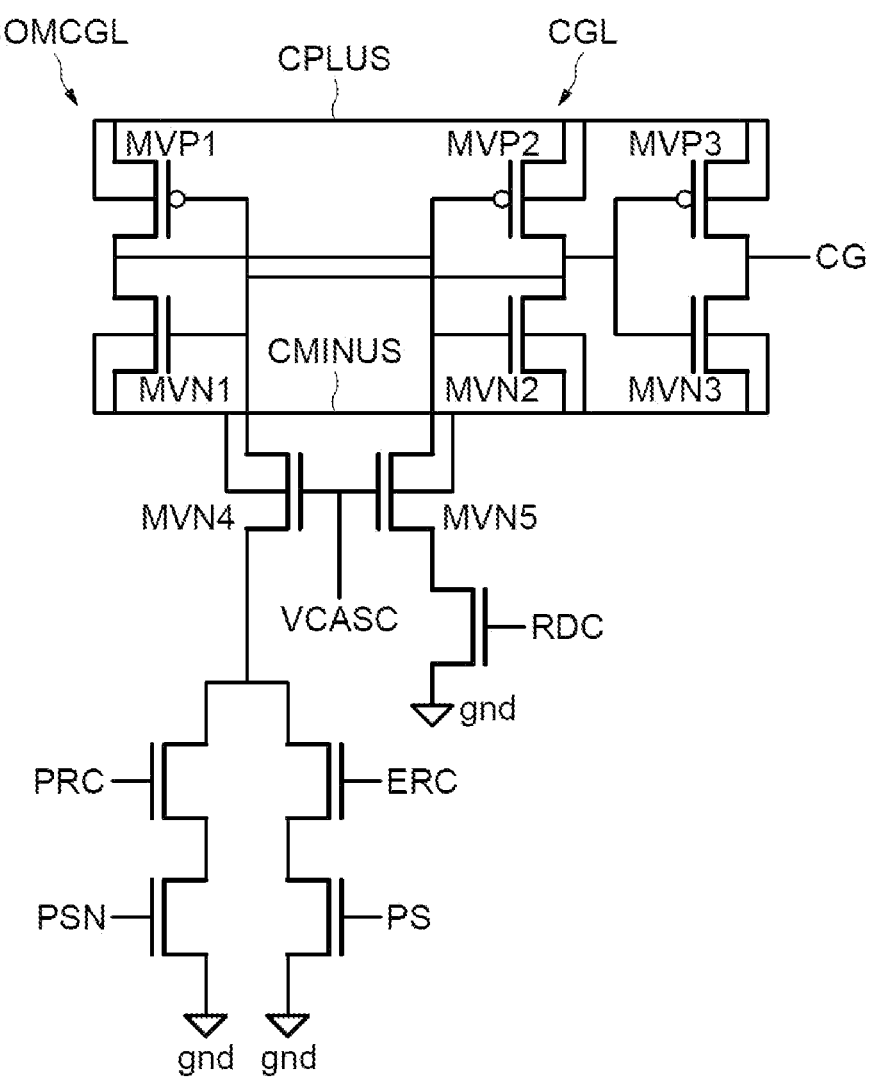
FIG. 2D illustrates a command circuit of a command gate latch.

FIG. 2D illustrates an example of a command circuit of a command gate latch COMCGL.

The local word decoder WSW therefore further includes a command circuit of a command gate latch COMCGL dedicated to the reads and writes in the non-volatile memory cells EE of the memory points BTCL of the memory word WD.

The command circuit COMCGL dedicated to reads and writes in the non-volatile memory cells EE includes a command gate latch CGL including a first pair of complementary MOS transistors MVP1, MVN1 forming a first inverter and a second pair of complementary MOS transistors MVP2, MVN2 forming a second inverter. The two inverters are mounted antiparallel to maintain a high level voltage CPLUS or a low level voltage CMINUS on an input of a third inverter. The third inverter includes a third pair of complementary MOS transistors MVP3, MVN3 and its output supplies a command gate signal CG at the high level voltage CPLUS or at the low level voltage CMINUS.

The input of the first inverter MVP1, MVN1 can be forced to the low level by a cascode transistor MVN4 on a write command branch. The input of the second inverter MVP2, MVN2 can be forced to the low level by another cascode transistor MVN5 on a read command branch. The cascode transistors MVN4, MVN5 are commanded by a cascode command voltage VCASC.

A command circuit of the command gate latch CGL is configured to force an output state of the latch CGL by imposing signals on the read and write command branches.

A transistor is coupled in series to the ground gnd on the read command branch and is commanded by a read command signal RDC.

Thus, if the state machine ME activates the read command signal RDC (RDC=1), the output of the second inverter MVP2, MVN2 is forced to the high level voltage CPLUS and the command gate signal CG at the low level voltage CMINUS is transmitted on the command gates of the state transistors TE of the non-volatile memory cells of the respective memory word WD (see FIG. 1).

The state machine generates the programming condition PRC and erasing condition ERC signals so as to transmit a voltage to the command gates CG of the state transistors TE depending on the cycle performed (erasing or programming) and the status of the memory word PS=0 or PS=1.

The write command branch, in turn, can be brought to ground gnd either by activating a programming condition signal PRC (PRC=1) and the complementary power status signal PSN (PSN=1, PS=0); or by activating an erase condition signal ERC (ERC=1) and the power status PS (PS=1, PSN=0). The programming PRC and erase ERC condition signals are generated by the state machine ME.

Thus, in erasure ERC=1 and, if PS=0 then CG=CMINUS while if PS=1 then CG=CPLUS.

In programming PRC=1 and, if PS=0 then CG=CPLUS while if PS=1 then CG=MINUS.

The high level voltage CPLUS and the low level voltage CMINUS are generated by the read RDM and write WRM means of the state machine ME, and allow timing read and write operations in the non-volatile memory cells EE, for example as described below, in particular in connection with FIGS. 4 and 9.

The timings of the read and write operations implemented by the state machine ME, in collaboration with the local decoders WSW of the memory words WD of the memory plane PM, will now be described with reference to FIGS. 3 to 9.

Figure 3:
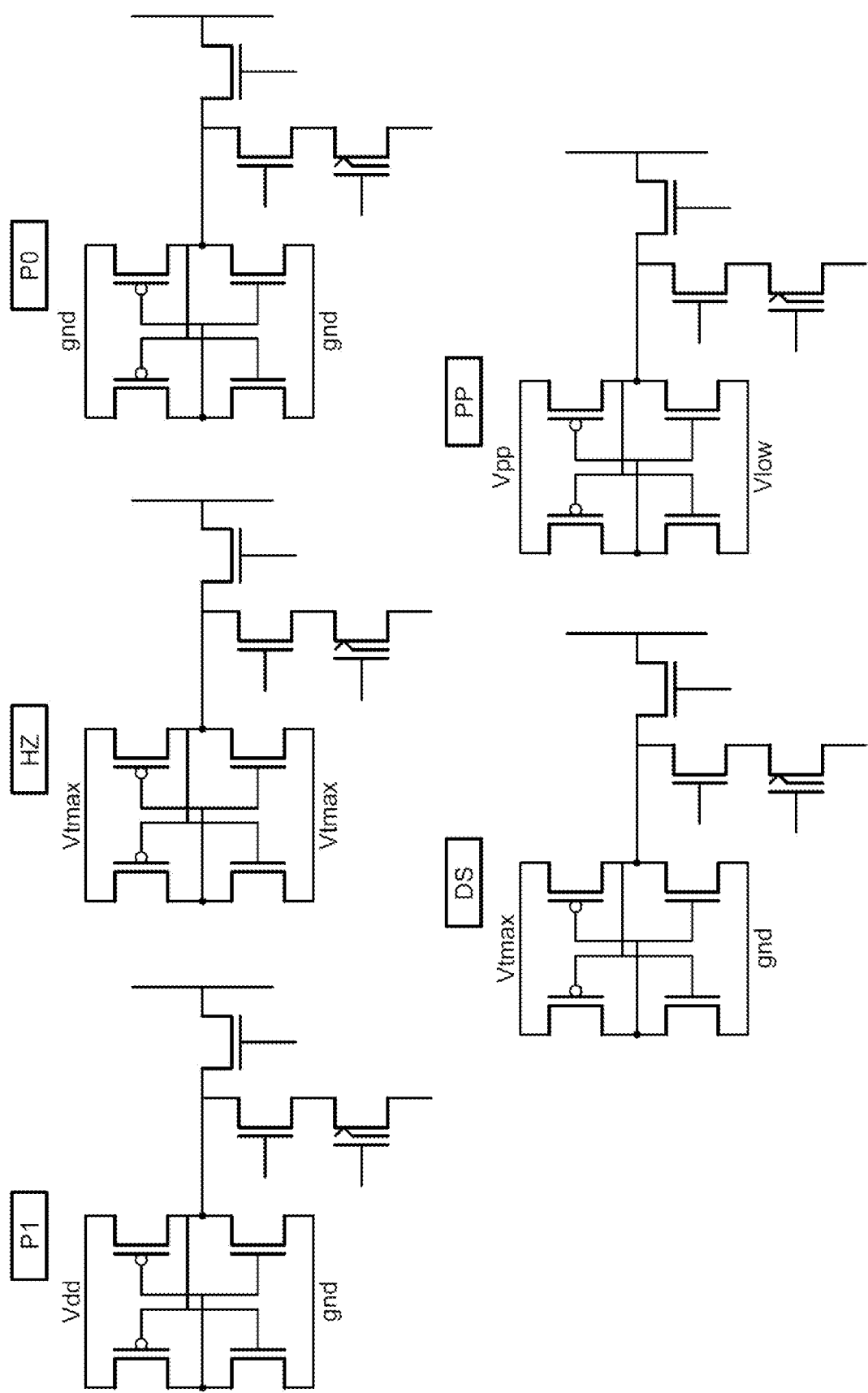
FIG. 3 different states of the volatile memory cells according to sets of voltages applied to power lines.

FIG. 3 shows different states of the volatile memory cells FF (as described previously in connection with FIG. 1) according to sets of voltages applied to the power lines SPLUS, SMINUS.

In a first state P1, a reference power potential of the device Vdd is applied to the high level power line SPLUS of the volatile memory cells FF of a memory word; and a reference potential of the device gnd, that is to say the ground, is applied to the low level power line SMINUS of the volatile memory cells FF of the memory word.

This first set of power voltages Vdd, gnd is thus provided for powering the volatile memory cells FF in an operational state P1, adapted for executing the memory function of the volatile memory cells FF.

The first set of power voltages Vdd, gnd can be generated by the state machine ME or else by the respective local decoder WSW.

In a second state HZ, the highest absolute threshold voltage value Vtmax among the transistors making up the bi-stable latch of a volatile memory cell FF, is applied both to the high level power line SPLUS and to the low level power line SMINUS of the volatile memory cells FF of the memory word.

This second set of power voltages Vtmax, Vtmax is thus provided for powering the volatile memory cells FF in a high impedance state HZ on the positive output Q.

The second set of power voltages Vtmax, Vtmax are generated by the state machine ME on the power lines SPLINE, SNLINE.

In a third state P0, the ground potential gnd is applied both to the high level power line SPLUS and to the low level power line SMINUS of the volatile memory cells FF of the memory word.

This third set of power voltages gnd, gnd is thus provided for powering the volatile memory cells FF in a power-off state P0 adapted to cease the memory function of the volatile memory cells FF.

The third set of power voltages gnd, gnd can be generated by the state machine ME or else by the respective local decoder WSW.

In a fourth state DS, a maximum threshold voltage Vtmax is applied to the high level power line SPLUS, and the ground gnd is applied to the low level power line SMINUS.

This fourth set of power voltages Vtmax, gnd is thus provided for powering the volatile memory cells FF in a discharge state DS adapted for discharging the polarizations of the internal nodes of the volatile memory cell FF.

The fourth set of power voltages gnd, gnd is generated by the state machine ME on the power lines SPLINE, SNLINE.

In a fifth state PP, a high level write voltage Vpp is applied to the high level power line SPLUS, and a low level write voltage Vlow is applied to the low level power line SMINUS.

Figure 9:
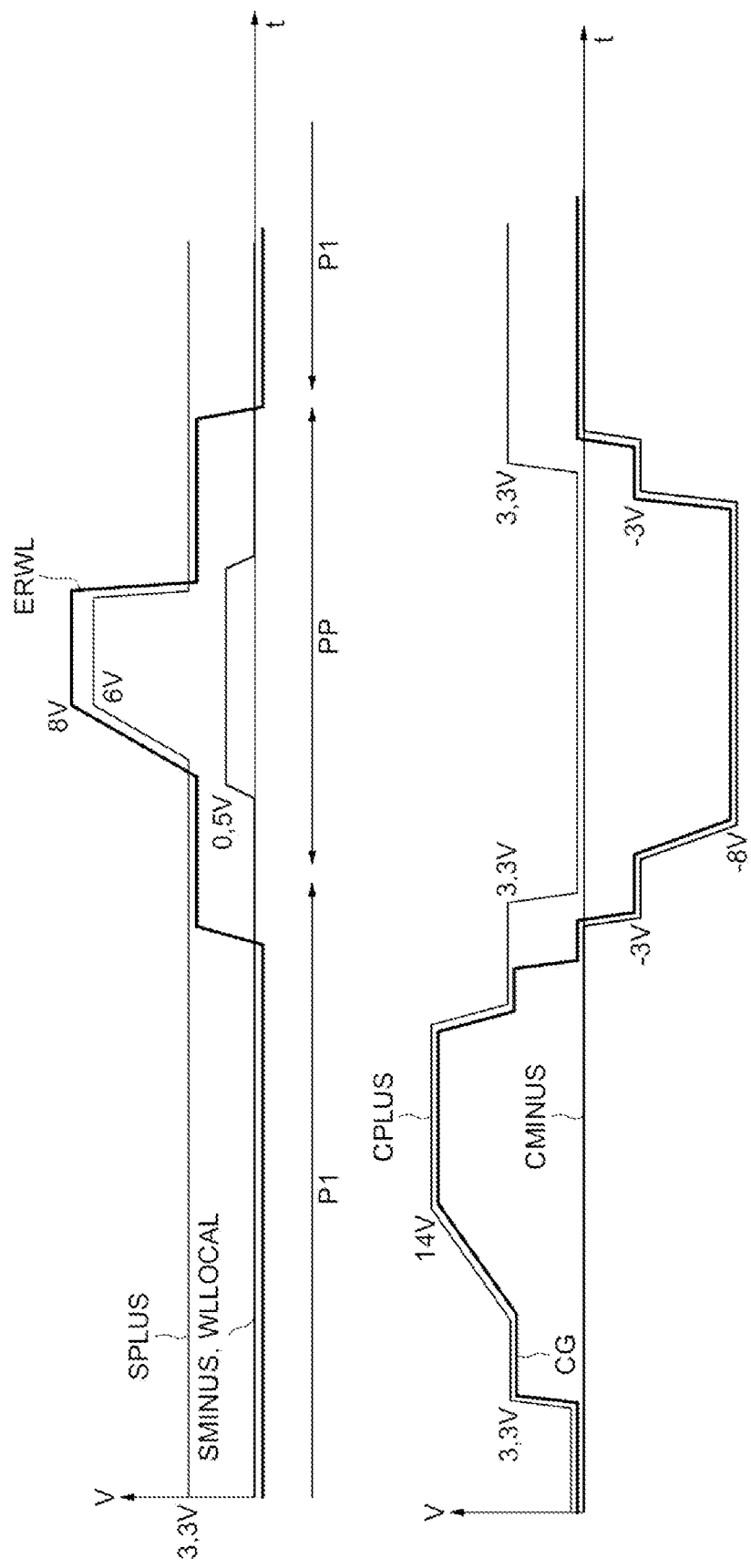
FIG. 9 illustrates generation of second write signals timing a write operation of non-volatile memory cells, with data recorded in the volatile memory cells of corresponding memory points, in all the memory words whose volatile memory cells store data.

This fifth set of power voltages Vpp, Vlow is intended to power the volatile memory cells FF in a non-volatile programming state PP, adapted for bringing the common node NC to a potential allowing a programming operation, in the non-volatile memory cell EE, of the datum recorded in the volatile memory FF (FIG. 9).

The fifth set of power voltages Vpp, Vlow is generated by the state machine ME on the power lines SPLINE, SNLINE.

The states called operating P1, high impedance HZ, power-off P0, non-volatile write PP, and discharge DS states, thus commanded on the power supplies SPLUS, SMINUS of the volatile memory cells FF, will allow implementing read and write operations in the memory plane as described below with reference to FIG. 4 and with reference to FIGS. 5 to 9.

Figure 4:
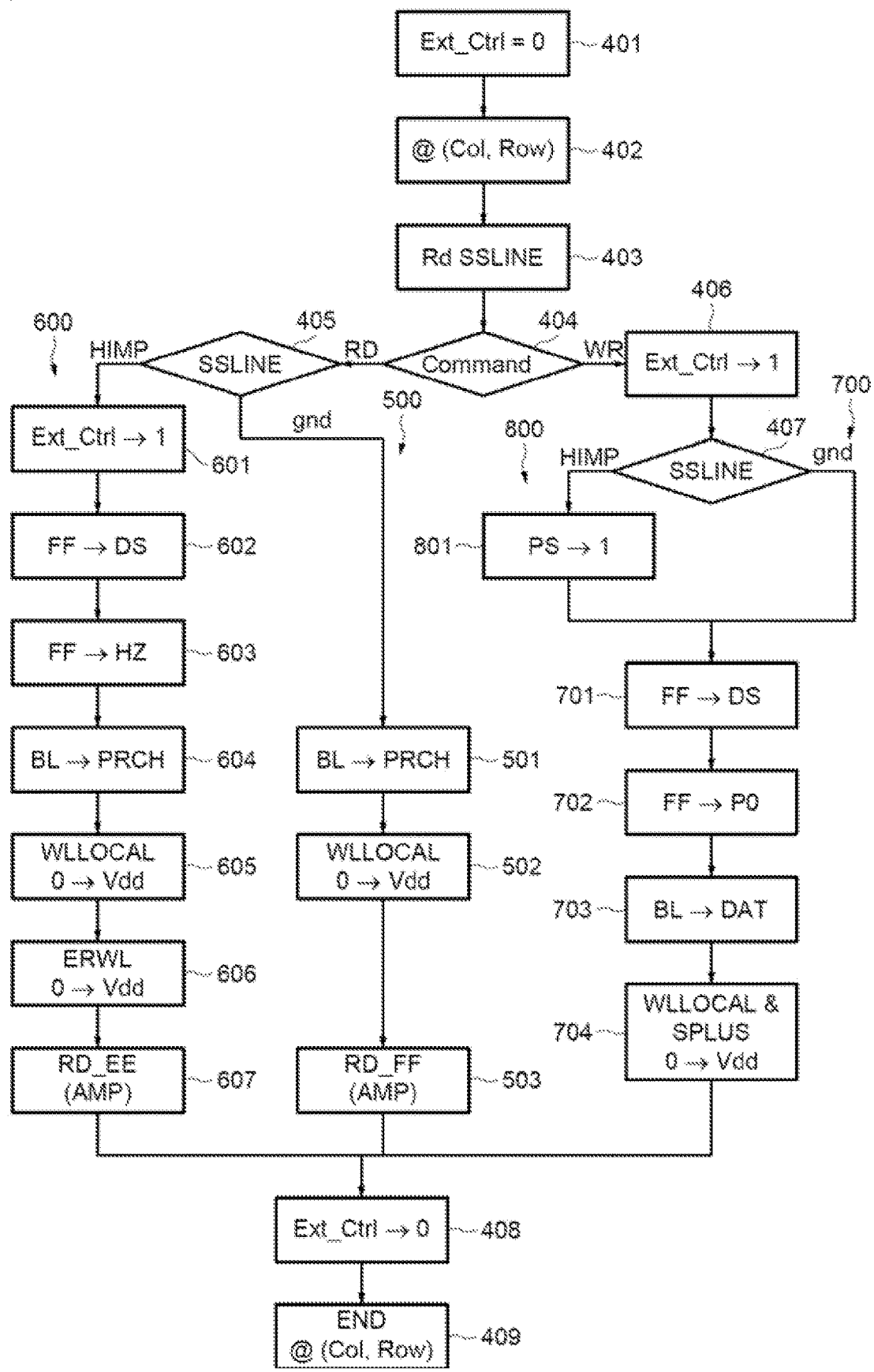
FIG. 4 illustrates implementation of a command method in a memory device.

FIG. 4 is a functional diagram of an example of implementation of a command method in a memory device NVSR as described above in connection with FIGS. 1 to 3 and with reference to FIGS. 10 and 11.

During an initialization phase 401, the state machine ME is awaiting receipt of a read RD or write WR command and supplies the external control signal Ext_Ctrl=0.

This corresponds to leaving the memory plane PM in its data storage function, where the volatile memory cells FF of the memory words whose power status PS is at the second value, PS=Vdd, are powered by the local decoder WSW, in the functional power state P1. The volatile memory cells FF of the memory words whose power status PS is at the first value PS=gnd, are powered by the local decoder WSW, in the power-off state P0. Any previous data of the memory words whose power status is at the first value PS=gnd are stored in the non-volatile memory cells EE.

A command is received in step 402 with the address @(Col, Row) of the memory word to be read or written. The Col, Row signals are transmitted to the local decoders to identify the selected memory word.

Then, in step 403, the state machine probes Rd SSLINE the selection and status SSLINE line of the local decoder WSW of the address Col, Row. The selection and status SSLINE line can have either a high impedance HIMP or a ground potential gnd, depending on the power status PS. The high impedance HIMP and the ground potential gnd respectively represent a non-powered state of the volatile memory cells FF, and a powered state of the volatile memory cells FF.

In step 404, a first condition is tested on the received command, which may be a read command RD or a write command WR.

If, in step 404, the command is a read command RD, and if in step 405 the line SSLINE is probed as being coupled to the ground gnd, then the volatile memory cells FF store the data of the selected word, and are powered in the operational state P1 by the local decoder WSW.

Figure 5:
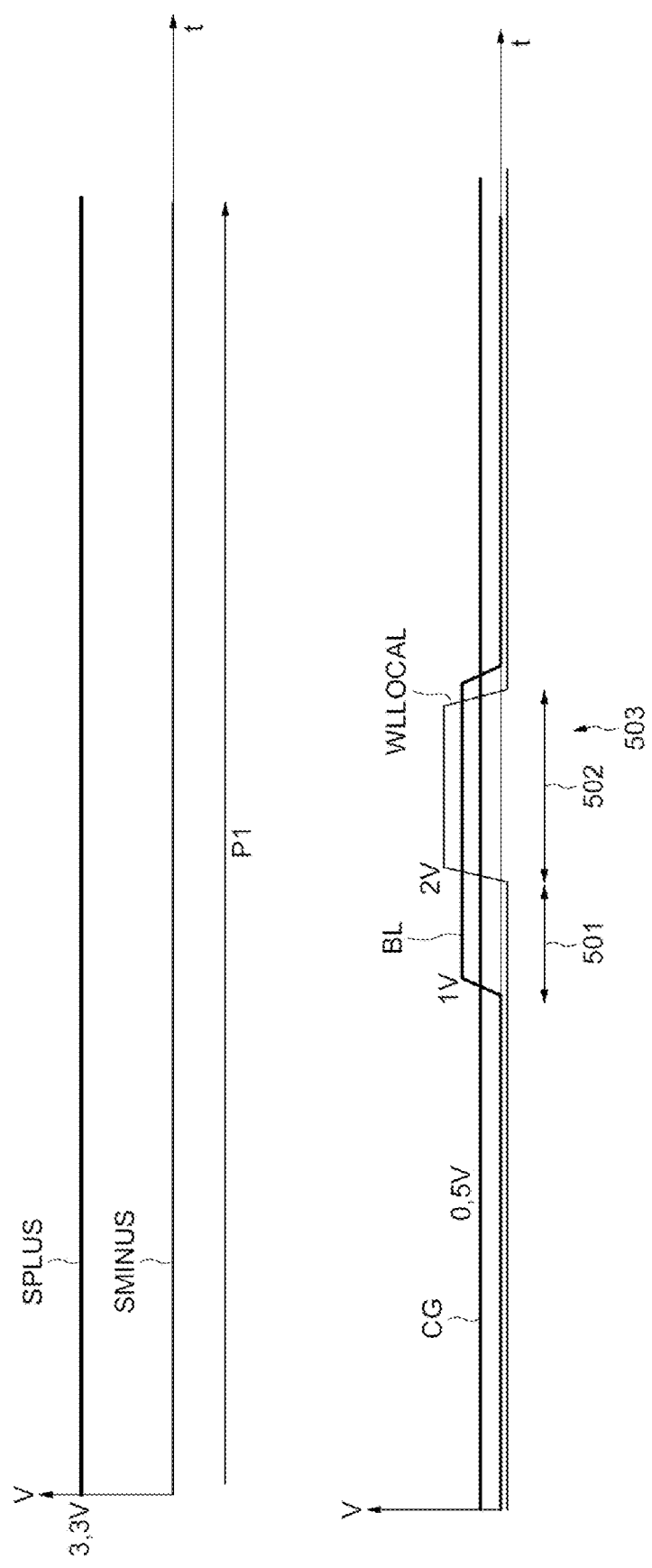
FIG. 5 illustrates generation of second read signals adapted for timing read operations in volatile memory cells of a selected memory word.

A read operation 500 is performed in the volatile memory cells FF by means of second read signals as illustrated in FIG. 5.

FIG. 5 shows an example of generation of the second read signals adapted for timing read operations in the volatile memory cells FF of the selected memory word Col, Row.

During reading 500, the power lines SPLUS, SMINUS are in the operational state P1, with for example SPLUS=Vdd=3.3V and SMINUS=gnd.

First, in step 501, a pre-charge voltage PRCH, for example at the threshold voltage of an NMOS transistor of substantially 1V, is generated on the bit line BL of the memory points BTCL read in the selected memory word.

Then, in step 502, the local word line WLLOCAL is brought to a potential turning the selection transistors MN3 on, for example twice the pre-charge voltage PRCH of substantially 2V, in order to couple the common node NC to the pre-charge potential PRCH.

Finally, in step 503, the datum is read RD_FF by measuring a current variation on the bit line BL.

A read amplifier AMP typically intended for reading EEPROM memories can be used in this regard.

However, in order to avoid parasitic switching of the datum recorded in the volatile memory cell FF, it is advantageously provided to impose a voltage fixed at twice the threshold voltage of the NMOS transistors of the memory point BTCL (substantially 2V) on the local word line WLLOCAL. Thus, the positive output Q of the cell FF, when it is grounded gnd, cannot be brought above the threshold voltage of the transistor MN1 (substantially 1V) by the pre-charge of the read circuit, and by the additional limitation ensured by the limited gate voltage (WLLOCAL) of the transistor MN3. This avoids the parasitic switching of the volatile memory cell FF potentially caused by conducting the transistor MM. If the output Q is at Vdd, there is no danger of parasitic switching.

This read operation 500 allows reading the data in the bi-stable latches of the volatile memory cells FF with a single asymmetric bit line, without differential reading on the complementary output QN, in a reliable manner and without electrical conflict between the power lines SPLUS, SMINUS and the outputs Q, QN.

Reference is again made to FIG. 4.

In step 405, when the command 404 is a read command RD, if the line SSLINE has a high impedance, then the volatile memory cells FF are in the power-off state P0 and do not store the data of the selected word. Thus, the data must be read from the non-volatile memory cells EE.

Figure 6:
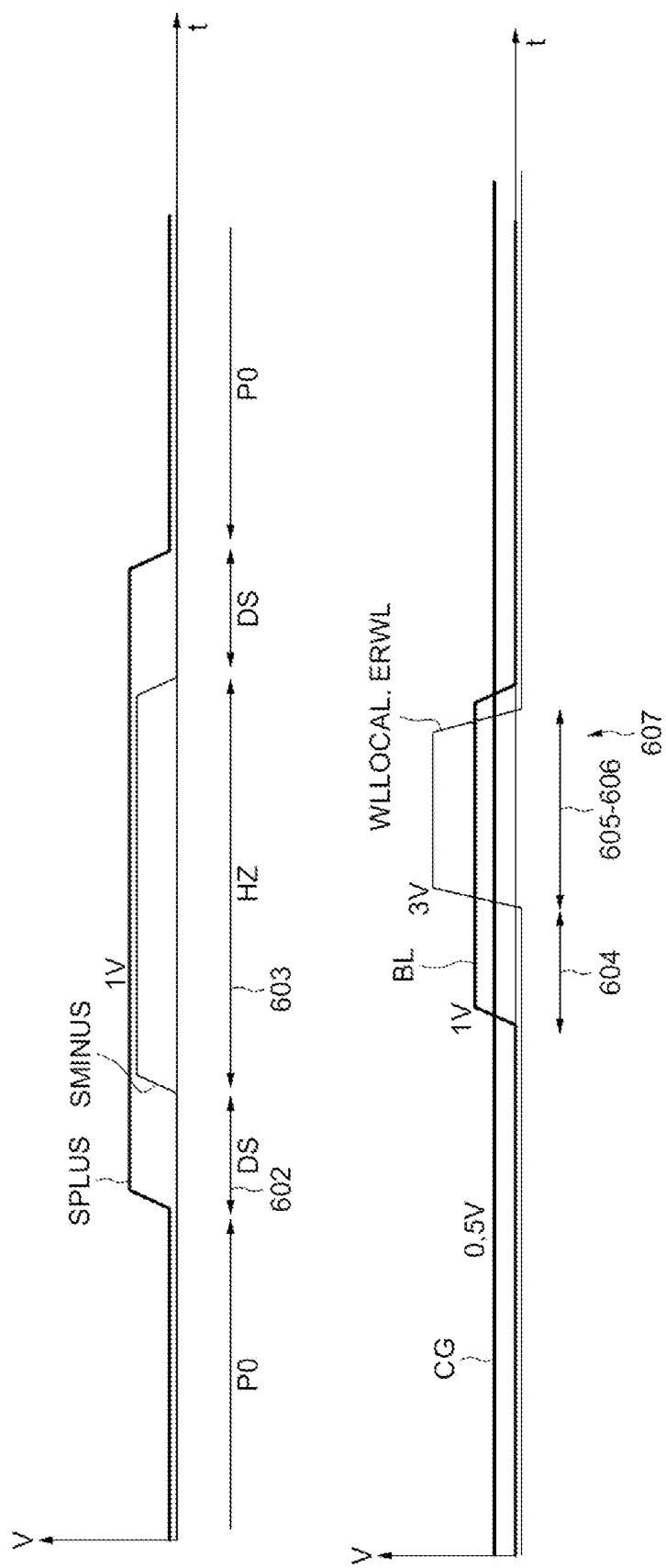
FIG. 6 illustrates generation of first read signals adapted for timing read operations in non-volatile memory cells of a selected memory word.

A read operation 600 is carried out in the non-volatile memory cells EE by means of first read signals as illustrated in FIG. 6.

FIG. 6 shows an example of generation of the first read signals adapted for timing read operations 600 in the non-volatile memory cells EE of the selected memory word Col, Row.

First, in step 601, the external control signal Ext_Ctrl is brought to 1 by the state machine ME to take control of the power lines SPLUS, SMINUS.

Then, in steps 602, 603, the volatile memory cells FF are placed in a state allowing not to disturb the reading in the non-volatile memory cells EE.

The volatile memory cells FF are initially in the power-off state P0, but a parasitic floating voltage may remain on the positive output Q.

Thus, an optional step 602 comprises placing the volatile memory cells FF in the discharge state DS, discharging the polarizations of the internal nodes of the volatile memory cell FF.

Then, in step 603, the volatile memory cells FF are placed in the high impedance state HZ, imposing a high impedance floating potential on the positive output Q of the volatile memory cells FF of the selected memory word.

Then, a reading of the datum recorded in the non-volatile memory cell EE is implemented with the read amplifier AMP.

More specifically, in step 604 a pre-charge voltage PRCH is generated on the bit line BL and in step 605 the local word line WLLOCAL is brought to the potential Vdd.

In step 606, the access transistor TA is turned-on on the word line ERWL, at the same time as the command of the selection transistors WLLOCAL of step 605.

The word line commands ERWL, WLLOCAL are brought to Vdd, for example Vdd=3.3V.

Reading RD_EE in a non-volatile memory cell is carried out in step 607.

In the example of FIG. 6, provision is further made to bring the power lines back into state P0, optionally passing through the discharge state DS, after reading 607.

Reference is again made to FIG. 4.

If, in step 404, the command is a write command WR, then the state machine ME brings the external control signal Ext_Ctrl to 1, independently of the value of the power status PS measured on the selection and status line SSLINE.

Then, in step 407, if the line SSLINE is probed as being coupled to the ground gnd, then the volatile memory cells FF have already been written at least once and are powered in the operational state P1 by the local decoder WSW.

Figure 7:
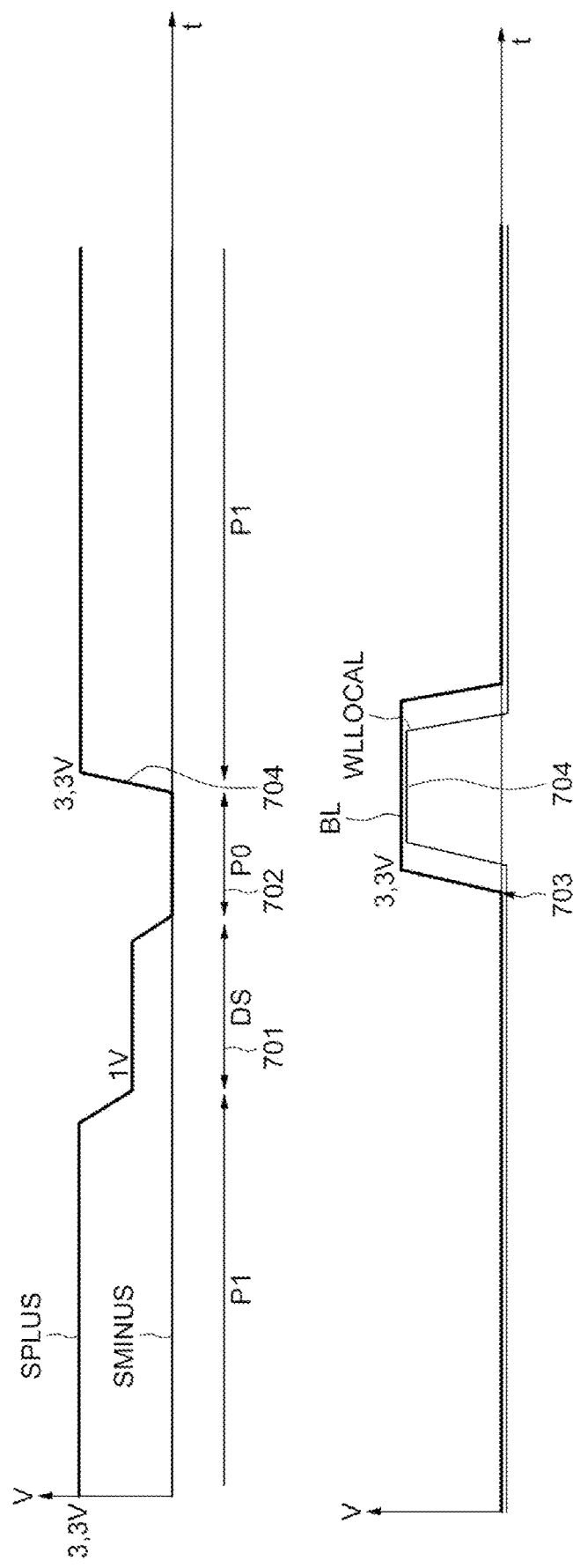
FIG. 7 illustrates generation of first write signals adapted for timing write operations in volatile memory cells of a selected memory word.

A write operation 700 is carried out in the volatile memory cells FF by means of first write signals as illustrated in FIG. 7.

FIG. 7 shows an example of generation of the first write signals adapted for timing write operations 700 in the volatile memory cells FF of the selected memory word Col, Row.

The volatile memory cells FF are therefore initially in the operational state P1, and are brought to the power-off state P0 during a step 702, advantageously by means of the discharge state DS during a step 701 (optional).

In step 703, the volatile memory cells FF are in the power-off state P0, and the write means WRM bring the bit line BL to a voltage representative of the datum to be written DAT. For example, the bit line BL is brought to Vdd=3.3V if the datum DAT is 1, and to gnd if the datum DAT is 0.

Then, in step 704, the selection transistors MN3 of the memory points of the memory word are turned-on by a local word line voltage WLLOCAL for example at Vdd=3.3V.

The common nodes NC of the memory points BTCL and the positive outputs Q of the volatile memory cells FF are brought to the potential of the datum DAT.

The potential of the datum DAT may for example be worth substantially 2V if the datum is a "1", that is to say that the voltage on the common node NC rises to 3.3V minus the voltage of the selection transistor MN3 (affected by a substrate effect), in the case where the bit line voltage BL is at 3.3V and the local word line voltage WLLOCAL is at 3.3V.

The potential of the datum DAT is for example the ground gnd if the datum is a "0".

At this time, in the same step 704, the volatile memory cells FF are commanded in the operational power state P1, and record the value of the positive output Q thus imposed before switching to the operational state P1.

The bit line BL and word line WLLOCAL voltages are then released.

Reference is again made to FIG. 4.

In step 407, if the line SSLINE is probed at high impedance HIMP, then the volatile memory cells FF have never been written and are in the power-off state P0 by the local decoder WSW.

In step 801, the external control signal Ext_Ctrl and the address signals Col, Row fulfill the triple input condition (mentioned previously in connection with FIG. 2B) and the power status PS definitively switches to the second value, PS=1.

Thus the respective local decoder WSW is configured to provide the power status PS with the second value, during the first write operation 800 in the memory word.

Figure 8:
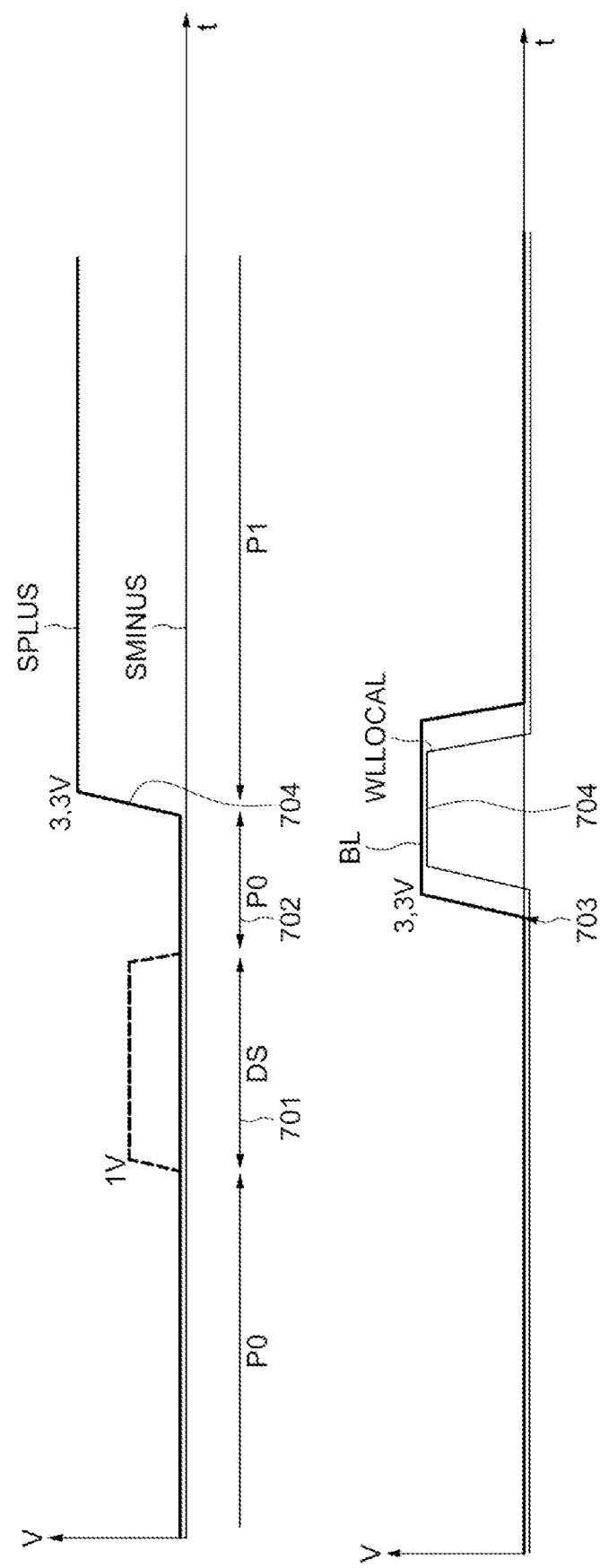
FIG. 8 illustrates generation of first write signals adapted for timing first write operations in volatile memory cells of a selected memory word.

A first write operation carried out in the volatile memory cells FF by means of first write signals as illustrated in FIG. 8.

FIG. 8 shows an example of generation of the first write signals adapted for timing first write operations 800 in the volatile memory cells FF of the selected memory word Col, Row.

The timing of the first write operation is actually the same timing as the write operation 700 of the volatile memory cells FF already written.

The volatile memory cells FF are therefore initially in the power-off state P0, and remain in the power-off state P0 from step 702, optionally via the discharge state DS during step 701.

The writing is done in the same way in steps 703 and 704, by putting into operation, in the operational state P1, the volatile memory cells FF after having charged the positive output Q to the value of the datum DAT.

The write operations 700 and 800 allow writing in the bi-stable latches of the volatile memory cells FF with a single asymmetric bit line, without differential command on the complementary output QN, in a reliable manner and without electrical conflict between the power lines PSLUS, SMINUS and the outputs Q, QN.

Reference is again made to FIG. 4.

In step 408, the read operations 500, 600 and the write operations 700, 800 are thus completed at the end of the respective steps 503, 607, and 704, and the state machine ME returns the external control signal Ext_Ctrl to 0, then ends access to the selected memory word (END@(Col, Row)) by a step 409 which loops back to the initial step 401.

A new write or read command can thus be received in step 402, as long as the memory device NVSR is switched on.

In the case of shutdown of the memory device NVSR, the state machine ME is configured to record in a non-volatile manner the data written in the volatile memory cells FF of the various memory points BTCL of the memory plane PM.

Reference is made in this regard to FIG. 9 described below.

It will be noted that the read operation 500 and the write operations 700 and 800 are adapted for reading and writing in the bi-stable latches of the volatile memory cells FF which include only one single asymmetric bit line, "mono bit line".

Thus an integrated circuit can be provided comprising a static volatile memory device including at least one memory point having a volatile memory cell FF comprising an output called positive output Q and a complementary output called negative output QN, wherein the positive output Q is coupled to an access node NC, wherein the negative output QN is not connected to any node outside the volatile memory cell FF, and wherein a selection transistor MN3 is coupled between the access node NC and the single bit line BL.

This corresponds to a memory point BTCL as described above in connection with FIG. 1, but not including the non-volatile memory cell EE coupled to the access node NC (or common node NC).

The memory points can of course be organized into memory words in a memory plane, and the device comprises a local decoder WSW dedicated to each memory word. The local decoder WSW and the state machine can thus be the same as previously described in connection with FIG. 2A, but, of course, not including the command circuit of the command gate latch COMCGL, dedicated to reads and writes in the non-volatile memory cells EE, and described in connection with FIG. 2D.

The read operation in the volatile memory cells FF described in connection with FIGS. 3, 4 and 6 apply strictly speaking to such a "single bit line" static volatile memory device, and the write operations in the volatile memory cells FF described in connection with FIGS. 3, 4, 7 and 8 apply strictly speaking to such a "single bit line" static volatile memory device.

The framework of the non-volatile static random access memory device NVSR, in particular of FIG. 1, is now reconsidered.

FIG. 9 shows an example of generation of second write signals timing a write operation of the non-volatile memory cells EE, with the data recorded in the volatile memory cells FF of the corresponding memory points BTCL, in all the memory words WD whose volatile memory cells FF store data.

The write means WRM of the state machine ME are configured to implement write operations in the non-volatile memory cells. A write operation called non-volatile write operation comprises an erase cycle followed by a programming cycle.

References will be made to the elements of the command circuit of the command gate latch COMCGL dedicated to reads and writes in the non-volatile memory cells EE, belonging to the local decoder WSW of a memory word, described previously in connection with FIG. 2D.

It is recalled that the condition signals of the state machine ERC, PRC are generated to transmit a voltage to the command gates CG of the state transistors TE depending on the cycle carried out (erasure or programming) and on the state of the memory word defined by the status PS (PS=0 or PS=1).

The erase cycle comprises applying an erase voltage between the command gate CG and the drain of the state transistors TE, which is sufficient to implement a charge injection into the floating gate by the Fowler-Nordheim effect.

A positive erase voltage of 14V is generated by a high voltage generator HVGEN (FIG. 2A) and is applied to the high level power CPLUS of the command gate latch CGL. The low level power CMINUS of the command grid latch CGL is brought for example to 3V.

In erasure, ERC=1 and if PS=0 then CG=CMINUS=3V (by the mechanism of the command circuit of the command gate latch COMCGL, described previously in connection with FIG. 2D) and there is no implementation of an erasure cycle in this word-memory.

If PS=1 then CG=CPLUS=14V and an erasure cycle is implemented in this word-memory.

A conduction channel is created between the source and the drain of the state transistor (the state transistor is considered to be of the N-type), and a source potential, which is grounded gnd, is transmitted to the drain by the channel.

The voltage between the command gate and the drain is thus 14V and generates an erasure by injecting charges into the floating gate.

During erasure, the access transistor TA is turned-off by a grounded gnd word line signal ERWL.

Then, the programming cycle comprises an application of a programming voltage between the command gate CG and the drain of the state transistors TE, which is sufficient or not to implement an injection of opposite charges into the floating gate by Fowler-Nordheim effect, if the datum to be stored is, arbitrarily, a 1.

The datum to be stored is recorded on the output Q of the volatile memory cell FF, thus powered in the operational state P1.

Then, the access transistor TA is turned-on during programming in order to couple the output Q with the drain of the state transistor TE.

A negative programming voltage of −8V is generated by a high voltage generator HVGEN (FIG. 2A) and is applied to the low level power CMINUS of the command gate latch CGL. The high level power CPLUS of the control grid latch CGL is brought for example to 0V (gnd).

In programming, PRC=1 and if PS=0 then CG=CPLUS=gnd (by the mechanism of the command circuit of the command gate latch COMCGL, described previously in connection with FIG. 2D) and there is no implementation of a programming cycle in this word-memory.

If PS=1 then CG=MINUS=−8V and a programming cycle in this word-memory is possible and conditioned by the level on the drain of the state transistor TE, that is to say by the output Q of the bi-stable latch of the volatile memory cells FF.

The write means WRM are configured to place the volatile memory cells FF in the state called non-volatile programming state PP (FIG. 3), and generate a positive programming voltage at +6V on the high level power line SPLUS.

The low level power line SMINUS is brought to the potential Vlow, which is for example positive non-zero at 0.5V, in order to reduce the leakage currents in the bi-stable latches of the volatile memory cells FF. Consequently, this allows reducing the overall consumption in programming.

At the same time, the access transistor TA is turned-on through a word line voltage ERWL which follows the level of the voltage SPLUS, at +8V for example.

Thus, if the volatile memory cell FF contains a datum equal to "1", the positive output Q is brought to the positive programming voltage of +6V, and this positive programming voltage (+6V) is transmitted on the drain of the state transistor TE.

The first negative programming voltage (−8V) on the command gate CG and the second positive programming voltage (+6V) on the drain of the state transistor TE constitute conditions of the Fowler-Nordheim effect, and the non-volatile memory cell EE records in a permanent (non-volatile) manner the datum of the output Q equal to "1".

And, if the volatile memory cell FF contains a datum equal to "0", the positive output Q is brought to the low level power voltage SMINUS at Vlow=0.5V.

The first negative programming voltage (−8V) on the command gate CG and the low level power voltage Vlow on the drain of the state transistor TE do not constitute conditions of the Fowler-Nordheim effect, and the non-volatile memory cell EE records in a permanent (non-volatile) manner the datum of the output Q equal to "0", as a result of the erasure and the absence of programming.

This non-volatile write operation is implemented in all the memory words WD of the memory plane PM whose power status PS has the second value, that is to say in all the memory words WD of the memory plane PM whose volatile memory cells FF have been written and contain a datum. The operation can for example be implemented simultaneously in the memory words WD of the memory plane PM.

The write operation can of course be commanded by a user, in which case the non-volatile write stimuli could be generated with a main power supply normally distributed to the device.

The write operation is moreover systematically commanded in the case of shutdown of the memory device NVSR, which is voluntary or not, in which case a secondary power stage is advantageously provided to supply the energy allowing to generate the non-volatile write stimuli.

Figure 12:
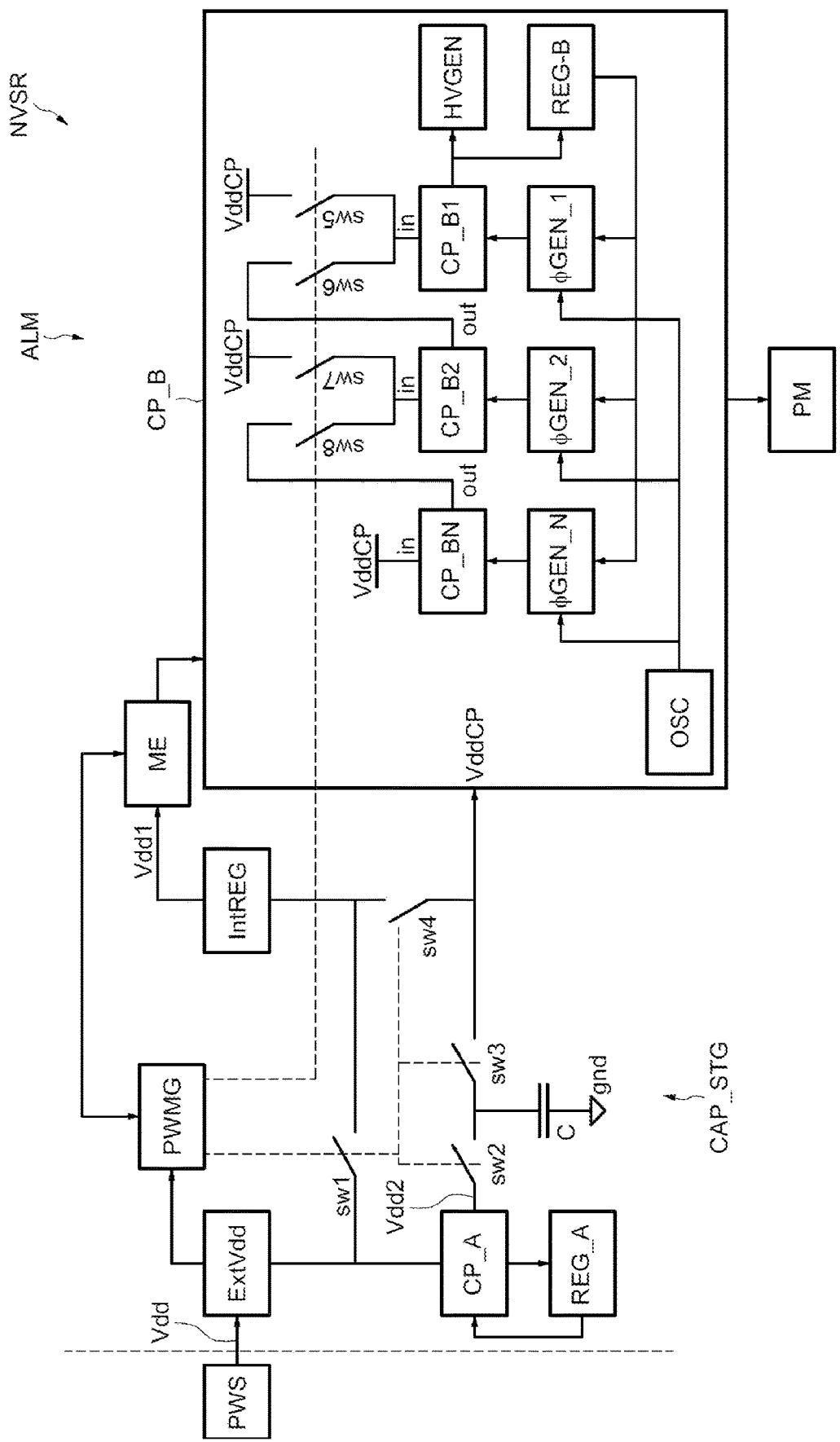
FIG. 12 illustrates a power device, which can be incorporated into the integrated circuit chip of FIG. 11.

Reference is made in this regard to FIG. 12.

FIG. 12 illustrates an example of an advantageous power device ALM, which can for example be incorporated into the integrated circuit chip described previously in connection with FIG. 11.

The Power device ALM comprises a main power stage PWS intended to supply a first power voltage Vdd on an external power node ExtVdd.

The first power voltage Vdd is adapted for the operation of a memory device, for example a non-volatile static random access memory device NVSR as described above in connection with FIGS. 1 to 11.

The power device ALM further comprises a secondary power stage CAP_STG intended to supply a second power voltage Vdd2 to the memory device NVSR, in the case of shutdown of the memory device NVSR.

The secondary power stage CAP_STG includes a capacitor C intended to be charged at the second power voltage Vdd2, and a first charge pump circuit CP_A, REG_A configured to generate the second power voltage Vdd2 from the first power voltage Vdd, at a level higher than the level of the first power voltage Vdd.

Thus, as will be seen below, by increasing the voltage charging the capacitor C, and advantageously by optimising the efficiency of the charge pumps of the high voltage generator of the memory (see CP_B below), it is possible to operate the memory device with a capacitor C of low capacitive value and to allow the low voltage operation of the memory device.

Furthermore, the higher temperature operation is also facilitated, since the required additional energy caused by the high temperature leakage current is attenuated by a greater amount of energy stored in the capacitor.

This allows reducing costs and expanding the application spectrum of the non-volatile static random access memory devices, previously limited by a high price.

The memory device NVSR in this example includes a state machine ME, for example as described above in connection with FIGS. 1 to 11, and a high voltage generator HVGEN incorporating a second charge pump circuit CP_B.

The state machine ME is powered by a constant regulated voltage Vdd1, at the output of an internal regulation stage IntREG.

The power device ALM includes a power management circuit PWMG, configured to command switches sw1, sw2, sw3, sw4 in order to use either the main power stage PWS or the secondary power stage CAP_STG to power the memory device NVSR.

For example, in a first power mode, first switches sw1 and sw2 are closed and second switches sw3 and sw4 are open. The first power voltage Vdd is thus supplied to the device NVSR and to the first charge pump circuit CP_A, while the secondary power stage CAP_STG is disconnected from the device NVSR.

The first charge pump circuit CP_A is for example regulated by a closed-loop regulator REG_A.

The power management circuit PWMG is configured to detect a loss, that is to say a shutdown or a disconnection, of the main power supply PWS, for example by a voltage drop on the node ExtVdd receiving the first power voltage. The node ExtVdd is for example an integrated circuit package pin.

If that is the case, the power management circuit PWMG is configured to instantly switch into a second power mode wherein the switches sw1 and sw2 are open and the switches sw3 and sw4 are closed. The second power voltage Vdd2 is thus supplied by the capacitor C on a power input VddCP of the second charge pump circuit CP_B, and to the state machine ME via the regulator IntREG, while the main power stage PWS is disconnected from the device NVSR.

The dimensioning of the capacitor C will now be discussed, with a view to be suitable for a non-volatile write operation as for example described above in connection with FIG. 9.

In the following, the reference C of the capacitor will also designate the capacitive value of the capacitor. In addition to the usual addition "+", subtraction "−" and division "/" symbols, the character "*" represents the symbol of multiplication, and the character "^" represents the symbol of the exponent (the expression "A power N" is thus symbolized by "A^N").

If the capacitor C is charged at an initial power voltage Vi, the charge stored in the capacitor is equal $C*Vi$, and represents an energy of $\frac{1}{2}*C*Vi^2$.

During a non-volatile write operation having an operating duration T, the energy is supplied by the capacitor C.

The energy expended by writing is $Ww=\frac{1}{2}*C*(Vi^2-Vf^2)$.

With, therefore, Vi the initial voltage across the capacitor C, and Vf the final voltage across the capacitor C after the duration T.

$$Vf=(Vi^2-2*Ww/C)^{\wedge}\tfrac{1}{2}$$

However, the final voltage Vf across the capacitor C must be high enough to allow the correct execution of the write command, and particularly for the proper operation of the charge pump CP_B which generates the write stimuli.

Conventional charge pumps are dimensioned to allow correct operation at the end of the write cycle, at the final voltage Vf. Consequently, the conventional charge pumps are oversized for the beginning of the write cycle, at the initial voltage Vi. Then, the efficiency of conventional charge pumps is not optimal throughout the duration of the write cycle, and worsens when the ratio between the initial voltage Vi on the final voltage Vf increases.

The estimates of the energy consumed Wi ($1 \leq i \leq 8$) by the functions respectively listed, in a memory device of the non-volatile static random access memory NVSR type as described above, are noted below in relation to the FIGS. 1 to 11:

Consumption of the memory plane during the erasure phase:

Charging a capacitor from 1 nF (command grids CG) to 15V; W1=113 nJ ($=\frac{1}{2}*1$ nF$*15V^2$)

Maintaining 15V for 2 ms, with a leakage current of 20 µA; W2=600 nJ (=2 ms*15V*20 µA)

Maintaining a voltage of 3V for 2 ms on the bi-stable latches FF, with a leakage current of 100 µA; W3=600 nJ (=2 ms*3V*100 µA)

Total for the erasure phase: 1313 nJ

Consumption of the memory plane during the programming phase:

Charging a capacitor from 1 nF (CG) to −8V; W4=320 nJ ($=\frac{1}{2}*1$ nF$*8V^2$)

Maintaining −8V for 2 ms, with a leakage current of 10 µA; W5=160 nJ (=2 ms*8V*10 µA)

Charging a capacitor from 10 nf (FF) to 3V; W6=45 nJ ($=\frac{1}{2}*10$ nF$*3V^2$)

Maintaining 5.5V for 2 ms, with a leakage current of 100 µA; W7=1100 nJ (=2 ms*5,5V*100 µA)

Total for the programming phase: 1625 nJ

Operating of the periphery during the write operation:

3V for 4 ms, with a current of 200 µA; W7=2400 nJ (=4 ms*3V*200 µA)

Thus, the total energy Wtot to be supplied by the charge pump powered by the capacitor C is worth: Wtot=Sum (Wi)=5338 nJ, rounded to Wtot=6 µJ by including various losses not mentioned in the list above.

With a conventional charge pump, the average efficiency of which is 20% during the write operation, the total energy consumed on the capacitor C is estimated at Wtotal=25 µJ.

This estimate of the energy Wtot is nevertheless lower than conventional non-volatile random access memory NVSRAM due in particular to the use of non-volatile memory cells EE of the EEPROM type, unlike the conventional use of the flash type non-volatile memory cells.

It is recalled that Wtotal=½*C*(Vi$^2$−Vf$^2$), and therefore Cmin=2*Wtotal/(Vi$^2$−Vf$^2$).

First, the dimensioning of a capacitor charged at an initial voltage Vi equal to the first power voltage Vdd, is presented below. This corresponds to an example of a conventional power stage not including in particular the first charge pump circuit CP_A, REG_A at the input of the capacitor C.

If Vi=Vdd=3V, Vf=1.8V and Wtotal=25 µJ, then Cmin=8.7 µF namely a capacitor C with capacitive value C=10 µF in practice.

If Vi=Vdd=1.8V, Vf=1.6V and Wtotal=25 µJ, then Cmin=73 µF namely a capacitor C with capacitive value C=100 µF in practice.

Thus, in the conventional power devices powering the memory device NVSR described above, a capacitor C with a capacitive value of at least 10 µF must be provided for a first power voltage Vdd of 3V, and a capacitor C of capacitive value of at least wog must be provided for a first power voltage Vdd of 1.8V.

Second, if the capacitor C is charged at the second power voltage Vdd2 (=Vi) leaving the first charge pump CP_A, with Vdd2>Vdd, then Cmin can decrease significantly, the difference being all the more visible if Vdd is low, for example if Vdd=1.8V.

It is recalled that Cmin=2*Wtotal/(Vi$^2$−Vf$^2$), and the estimate of energy consumption Wtotal=25 µJ is resumed.

If Vi=Vdd2=5.5V, Vf=1.6V and Wtotal=25 µj, then Cmin=1.8 µF, namely a capacitor C with capacitive value C=2.2 µF in practice.

The charge pumping CP_A stores more energy in the capacitor C and thus allows a drastic reduction in the capacitive value of the capacitor C. This represents an important advantage on the cost of the device and the surface used by the capacitor C.

Furthermore, the additional consumption in normal operation caused by the first charge pump CP_A, for example to compensate for pressure drops due to internal leakage in the capacitor C, is negligible.

Indeed, with a typical insulation resistance of 100 Ω.F (Ohm.Farad), the current at 5.5V for 2.2 µF is of 120 nA. The energy loss is 120 nA*5.5V=666 nW. For a charge pump CP_A efficiency of 25%, this gives a consumption of the charge pump CP_A of 2.66 µW, that is to say 1.5 µA under 1.8V, which is reasonably negligible.

Moreover, the power device ALM comprises a high voltage generator HVGEN incorporated into a second charge pump CP_B to generate the write stimuli of the memory device NVSR.

Thus, the high voltage generator HVGEN and the second charge pump CP_B of the power device ALM make up the write means WRM of the memory device NVSR.

The second charge pump CP_B comprises a plurality of elementary charge pump stages CP_B1, ΦGEN_1; CP_B2, ΦGEN_2; CP_BN, ΦGEN_N, each stage can be added to a series of elementary stages, wherein the amplified voltage leaving each stage is supplied at the input of the following stage.

Each elementary charge pump stage CP_Bk, ΦGEN_k ($1 \leq k \leq N$) typically includes a charge pump circuit CP_Bk capable of raising a voltage level by repercussions of charges in capacitive nodes, by switching commanded by a respective phase generator circuit ΦGEN_k. The phase generator circuits ΦGEN_k are timed by a clock signal generated by an oscillator circuit OSC.

The stages are thus adapted to be coupled in series so as to cumulate respective amplifications of the second power voltage Vdd2, for example by means of switches sw5, sw6, sw7, sw8 respectively coupled between the output (out) of one stage and the input (in) of the next stage.

For example (not shown), a switch can allow coupling the output of a group of elementary charge pump stages in series with the input of a following similar group. In an equivalent manner, the switches sw5, sw6, sw7, sw8 can be non-individually commanded, in groups.

A regulation stage REG-B is configured to regulate in closed loop the series of elementary charge pump stages CP_Bk, ΦGEN_k by making a command feedback to the phase generators ΦGEN_k.

The power management circuit constitutes a command means PWMG capable of measuring the present value of the second power voltage Vdd2 and commanding successive couplings of the different charge pump stages CP_B1, ΦGEN_1; CP_B2, OGEN_2; CP_BN, ΦGEN_N in the series.

Additional stage couplings in the series are continuously and monotonously commanded one by one, by following the decrease in the present value of the second power voltage Vdd2.

Indeed, according to the above example of the capacitor C, dimensioned at C=2.20 μF, the second voltage Vdd2 can decrease from 5.5V to 1.6V.

Thus, at the beginning, when the supply Vdd2 is maximum, only the first stages are used (charge pump CP_B1).

The command means PWMG measures the present value of the second power voltage Vdd2 for example from the value of the instantaneous voltage across the capacitor, or from the signal from the closed-loop regulator REG_A of the first charge pump CP_A.

If the circuit detects that the first charge pump stage CP_B1 is no longer able to supply the requested voltage, it connects the second stage CP_B2 in series with the first stage CP_B1.

The same process can be repeated up to a number N of elementary stages, for example N=15.

At the end of the write operation, the series can be equipped with all the active charge pump stages CP_B1, CP_B2, . . . , CP_BN.

The charge pump stages can be coupled in groups in the series, advantageously, in particular to reduce the complexity linked to fine granularity.

For example, if N=15, 3 groups of five "elementary" charge pump stages CP_Bk-CP_Bk+5 could be provided.

Thus, in the process described above, a plurality of elementary charge pump stages CP_Bk is coupled simultaneously in the series, each time that the command means PWMG detects that the series CP_B1-CP_Bk-1 is no longer able to supply the requested voltage.

In summary, the power device ALM described here in connection with FIG. 12 proposes to increase the initial charging voltage of the capacitor C above the rated voltage Vdd, for example by a factor 2, Vdd2=2*Vdd; and also proposes to reduce the energy consumed by the high-voltage signal generator HVGEN during a non-volatile write operation by dynamically optimising the efficiency of the second charge pump CP_B.

The power device ALM allows in particular reducing the size of the capacitor C, and operating at very low power voltages, for example 1.8V.

Thus, both the manufacturing costs and the congestion of the memory device are reduced, and the integration of the capacitor C into memory devices NVSRAM on a chip or inside a hybrid package is facilitated.

Of course, the power device ALM described in connection with FIG. 12 has its advantages for any type of memory device having similar needs.

This being the case, the power device ALM described in connection with FIG. 12 is particularly advantageously adapted to the non-volatile static random access memory device NVSR described in connection with FIGS. 1 to 11. Indeed, the memory device NVSR not only generates a space saving by itself, but further allows amplifying the space saving obtained by reducing the size of the capacitor C of the power device ALM, since the memory device NVSR has a reduced energy consumption, due to the presence of a single non-volatile memory cell EE per memory point BTCL, which is moreover of the EEPROM type.

What is claimed is:

1. An integrated circuit comprising:
    a memory device including at least one memory point comprising:
        a volatile memory cell and a single non-volatile memory cell coupled together to a common node; and
        a single selection transistor, which is coupled between the common node and a single bit line,
        wherein a first output of the volatile memory cell is coupled to the common node, and
        wherein a second output of the volatile memory cell, complementary to the first output, is not connected to any node outside the volatile memory cell.

2. The integrated circuit according to claim 1, wherein the volatile memory cell comprises a bi-stable latch including two inverters mounted antiparallel, and the non-volatile memory cell comprises a state transistor having a command gate and a floating gate and an access transistor coupled in series between the common node and the state transistor.

3. The integrated circuit according to claim 1, wherein the memory point includes a number of transistors equal to 7.

4. The integrated circuit according to claim 1, wherein the at least one memory point further comprises an isolation transistor coupled in series between the common node and the volatile memory cell.

5. The integrated circuit according to claim 4, wherein the memory point includes a number of transistors equal to 8.

6. The integrated circuit according to claim 1, wherein the memory device comprises a memory plane including a plurality of memory points arranged in at least one memory word, and one local decoder per memory word comprising power lines coupled to power terminals of the volatile memory cells of the respective memory word, and configured to store a power status in a status register, a first value of the power status being representative of a non-operating state of the volatile memory cells of the respective memory word, a second value of the power status being representative of an operating state of the volatile memory cells of the respective memory word.

7. The integrated circuit according to claim 6, wherein the local decoder is configured to maintain a first set of power voltages on the power lines, adapted for a functional powering of the volatile memory cells, as long as the power status has the second value.

8. The integrated circuit according to claim 6, wherein the memory device further includes read circuitry configured to generate first read signals adapted for timing read operations in the non-volatile memory cells of a selected memory word in response to the respective power status having the first value, and to generate second read signals adapted for timing read operations in the volatile memory cells of the selected memory word in response to the respective power status having the second value.

9. The integrated circuit according to claim 8, wherein the read circuitry is configured to generate, among the first read signals, a second set of power voltages on the power lines of the selected memory word, adapted to impose a high impedance floating potential on the first output coupled to the common node of the volatile memory cells.

10. The integrated circuit according to claim 8, wherein the read circuitry comprises a read amplifier configured to generate, among the first and second read signals, a precharge voltage on the bit line of a memory point which is read, and to detect a variation in current or voltage on the bit line, respectively during a read operation in the non-volatile memory cell and during a read operation in the volatile memory cell.

11. The integrated circuit according to claim 6, wherein the memory device further comprises write circuitry configured to generate first write signals adapted for timing write operations in the volatile memory cells of a selected memory word independently of any value of the power status, the local decoder of the respective memory word being configured to provide the power status with the second value, after a write operation.

12. The integrated circuit according to claim 11, wherein the write circuitry is configured to generate, among the first write signals, a third set of power voltages on the power lines of the selected memory word adapted to cease function of the volatile memory cells, then a datum signal to be stored on the common node imposed via the bit line of the memory points of the selected memory word, and then a first set of power voltages on the power lines, adapted for a functional powering of the volatile memory cells.

13. The integrated circuit according to claim 12, wherein the write circuitry is configured to generate, among the first write signals, a fourth set of power voltages on the power lines of the selected memory word, adapted for discharging polarizations of internal nodes of the volatile memory cells of the selected memory word, before generating the third set of power voltages.

14. The integrated circuit according to claim 12, wherein the write circuitry is configured to generate second write signals adapted for timing a write operation of the non-volatile memory cells with a datum recorded in the volatile memory cell of the corresponding memory point, in all the memory words whose respective power status has the second value, in response to a shutdown of the memory device.

15. The integrated circuit according to claim 14,
wherein the volatile memory cell comprises a bi-stable latch including two inverters mounted antiparallel, and the non-volatile memory cell comprises a state transistor having a command gate and a floating gate and an access transistor coupled in series between the common node and the state transistor; and
wherein the write circuitry is configured to generate, among the second write signals, an erase voltage on the command gate of the state transistor, and a first programming voltage on the command gate of the state transistor as well as a fifth set of power voltages on the power lines of the volatile memory cells adapted to bring the common node to a second programming voltage, in the memory words whose respective power status has the second value.

16. The integrated circuit according to claim 14, further comprising a power device comprising a main power stage intended to supply a first power voltage adapted for operating the memory device, and a secondary power stage intended to supply a second power voltage adapted for powering the write operation of the non-volatile memory cells in response to the shutdown of the memory device.

17. The integrated circuit according to claim 16, wherein the secondary power stage includes a capacitor intended to be charged at the second power voltage, and a first charge pump circuit configured to generate the second power voltage from the first power voltage, at a level higher than the level of the first power voltage.

18. The integrated circuit according to claim 16, wherein the power device further comprises at least one high voltage generator incorporated into the write circuitry of the memory device for generating the second write signals adapted for timing the write operation of the non-volatile memory cells, wherein the high voltage generator comprises a plurality of elementary charge pump stages, the stages being adapted to be coupled in series so as to cumulate respective amplifications of the second power voltage, and command circuitry configured to measure a present value of the second power voltage and to command successive couplings of elementary charge pump stages in the series, following a decrease in the present value of the second power voltage.

19. A method for commanding a memory device including at least one memory point comprising a volatile memory cell and a single non-volatile memory cell coupled together to a common node, a single selection transistor, which is coupled between the common node and a single bit line, a first output of the volatile memory cell being coupled to the common node, and a second output of the volatile memory cell, complementary to the first output, not being connected to any node outside the volatile memory cell, a memory plane including a plurality of the memory points arranged in at least one memory word, and one local decoder per memory word comprising power lines coupled to power terminals of the volatile memory cells of the respective memory word, the method comprising:
storing, in a status register, a power status for each memory word, a first value of the power status being representative of a non-operating state of the volatile memory cells of the respective memory word, and a second value of the power status being representative of an operating state of the volatile memory cells of the respective memory word.

20. The method according to claim 19, further comprising maintaining a first set of power voltages powering in an operational state the volatile memory cells of all the memory words whose power status has the second value.

21. The method according to claim 19, further comprising generating first read signals timing read operations in the non-volatile memory cells of a selected memory word in response to the respective power status having the first value, and generating second read signals timing read operations in the volatile memory cells of the selected memory word in response to the respective power status having the second value.

22. The method according to claim 21, further comprising generating, among the first read signals, a second set of power voltages imposing a high impedance floating potential on the first output coupled to the common node, in the volatile memory cells of the selected memory word.

23. The method according to claim 21, further comprising generating, among the first and second read signals, a pre-charge voltage on the bit line of a memory point, and detecting a variation in current or voltage on the bit line, respectively during a read operation in the non-volatile memory cell and during a read operation in the volatile memory cell.

24. The method according to claim 19, further comprising generating first write signals timing write operations in the volatile memory cells of a selected memory word independently of any value of the power status, and providing the respective power status with the second value, after a write operation.

25. The method according to claim 24, further comprising generating, among the first write signals, a third set of power voltages powering the volatile memory cells of the selected memory word, so as to cease function of the volatile memory cells, then a datum signal to be stored on the common node imposed via the bit line of the memory points of the selected memory word, and then a first set of power voltages powering the volatile memory cells of the selected memory word in an operational state.

26. The method according to claim 25, further comprising generating, among the first write signals, a fourth set of power voltages powering the volatile memory cells of the selected memory word so as to discharge polarizations of internal nodes of the volatile memory cells of the selected memory word, before each generation of the third set of power voltages.

27. The method according to claim 24, further comprising generating second write signals timing a write operation of the non-volatile memory cells with a datum recorded in the volatile memory cell of the corresponding memory point, in all the memory words whose respective power status has the second value, in response to a shutdown of the memory device.

28. The method according to claim 27, wherein the volatile memory cell comprises a bi-stable latch including two inverters mounted antiparallel, and the non-volatile memory cell comprises a state transistor having a command gate and a floating gate and an access transistor coupled in series between the common node and the state transistor, and the method further comprises:
   generating, among the second write signals, an erase voltage on the command gate of the state transistor, and a first programming voltage on the command gate of the state transistor as well as a fifth set of power voltages powering the volatile memory cells so as to bring the common node to a second programming voltage, in the memory words whose respective power status has the second value.

\* \* \* \* \*